(12) United States Patent
Troxel et al.

(10) Patent No.: US 8,884,585 B2
(45) Date of Patent: Nov. 11, 2014

(54) BATTERIES, BATTERY SYSTEMS, BATTERY SUBMODULES, BATTERY OPERATIONAL METHODS, BATTERY SYSTEM OPERATIONAL METHODS, BATTERY CHARGING METHODS, AND BATTERY SYSTEM CHARGING METHODS

(75) Inventors: Russell M. Troxel, Taylor, TX (US); Joel E. Sandahl, Drippings Springs, TX (US)

(73) Assignee: Valence Technology, Inc., Las Vegas, NV (US)

( * ) Notice: Subject to any disclaimer, the term of this patent is extended or adjusted under 35 U.S.C. 154(b) by 682 days.

(21) Appl. No.: 12/756,646

(22) Filed: Apr. 8, 2010
(Under 37 CFR 1.47)

(65) Prior Publication Data
US 2011/0095725 A1 Apr. 28, 2011

Related U.S. Application Data

(60) Provisional application No. 61/170,061, filed on Apr. 16, 2009.

(51) Int. Cl.
| | |
|---|---|
| *H02J 7/00* | (2006.01) |
| *H01M 10/48* | (2006.01) |
| *H01M 10/44* | (2006.01) |
| *H01M 10/42* | (2006.01) |
| *G01R 31/36* | (2006.01) |

(52) U.S. Cl.
CPC ........... *H02J 7/0013* (2013.01); *G01R 31/3624* (2013.01); *G01R 31/3689* (2013.01); *G01R 31/3658* (2013.01); *H01M 10/482* (2013.01); *H02J 2007/0067* (2013.01); *H01M 10/441* (2013.01); *H01M 10/4207* (2013.01)

USPC .......................................... 320/118; 320/132

(58) Field of Classification Search
USPC .......... 320/134, 132, 121, 119, 118, 166, 114
See application file for complete search history.

(56) References Cited

U.S. PATENT DOCUMENTS

| | | | |
|---|---|---|---|
| 4,502,001 A * | 2/1985 | Galloway | ...................... 320/122 |
| 5,633,573 A | 5/1997 | van Phuoc et al. | |
| 5,646,508 A | 7/1997 | van Phuoc et al. | |
| 5,652,502 A | 7/1997 | van Phuoc et al. | |

(Continued)

FOREIGN PATENT DOCUMENTS

| | | |
|---|---|---|
| CN | 1574540 | 2/2005 |
| JP | S 60-35923 | 2/1985 |

(Continued)

*Primary Examiner* — Arun Williams
(74) *Attorney, Agent, or Firm* — Wells St. John P.S.

(57) ABSTRACT

Batteries, battery systems, battery submodules, battery operational methods, battery system operational methods, battery charging methods, and battery system charging methods are described. According to one aspect, a battery includes a first battery terminal, a second battery terminal, and a plurality of submodules individually comprising a first submodule terminal, a second submodule terminal, a plurality of rechargeable cells electrically coupled between the first and second submodule terminals, and switching circuitry configured to electrically couple one of the first and second battery terminals with one of the first and second submodule terminals of one of the submodules during an engaged mode of operation of the one of the submodules and to electrically isolate the one of the first and second battery terminals from the one of the first and second submodule terminals of the one of the submodules during a disengaged mode of operation of the one of the submodules.

50 Claims, 9 Drawing Sheets

(56) References Cited

U.S. PATENT DOCUMENTS

| | | |
|---|---|---|
| 5,691,621 A | 11/1997 | van Phuoc et al. |
| 5,710,501 A | 1/1998 | van Phuoc et al. |
| 5,789,899 A | 8/1998 | van Phuoc et al. |
| 5,796,239 A | 8/1998 | van Phuoc et al. |
| 5,825,155 A | 10/1998 | Ito et al. |
| 5,903,131 A | 5/1999 | Sekine et al. |
| 5,928,419 A | 7/1999 | van Phuoc et al. |
| 5,982,145 A | 11/1999 | Eguchi |
| 6,060,864 A | 5/2000 | Ito et al. |
| 6,064,179 A | 5/2000 | Ito et al. |
| 6,177,779 B1 | 1/2001 | Eguchi |
| 6,583,603 B1 * | 6/2003 | Baldwin ............... 320/121 |
| 6,642,692 B2 | 11/2003 | Kinoshita |
| 6,919,707 B2 | 7/2005 | Kawai et al. |
| 6,984,961 B2 | 1/2006 | Kadouchi et al. |
| 7,019,488 B2 | 3/2006 | Nakao |
| 7,081,737 B2 | 7/2006 | Liu et al. |
| 7,091,700 B2 * | 8/2006 | Kadouchi et al. ............... 320/132 |
| 7,400,116 B2 | 7/2008 | Kato et al. |
| 7,463,008 B2 | 12/2008 | Takahashi |
| 7,535,199 B2 | 5/2009 | Kimura et al. |
| 7,696,725 B2 | 4/2010 | Liu et al. |
| 7,759,904 B2 | 7/2010 | Yasuhito et al. |
| 7,834,591 B2 | 11/2010 | Hussain et al. |
| 7,834,595 B2 | 11/2010 | Yasuhito et al. |
| 8,004,246 B2 | 8/2011 | Liu et al. |
| 8,018,205 B2 | 9/2011 | Yasuhito et al. |
| 8,183,835 B2 | 5/2012 | Takeda et al. |
| 8,237,411 B2 | 8/2012 | Liu et al. |
| 8,395,355 B2 | 3/2013 | Kaita et al. |
| 2001/0054877 A1 * | 12/2001 | Kinoshita ............... 320/112 |
| 2003/0129457 A1 | 7/2003 | Kawai et al. |
| 2003/0146737 A1 | 8/2003 | Kadouchi et al. |
| 2004/0257042 A1 | 12/2004 | Liu et al. |
| 2005/0077874 A1 | 4/2005 | Nakao |
| 2005/0231172 A1 | 10/2005 | Kato et al. |
| 2006/0192529 A1 | 8/2006 | Kimura et al. |
| 2006/0255769 A1 | 11/2006 | Liu et al. |
| 2006/0284597 A1 | 12/2006 | Takahashi |
| 2007/0139006 A1 | 6/2007 | Yasuhito et al. |
| 2007/0188134 A1 * | 8/2007 | Hussain et al. ............... 320/114 |
| 2007/0257642 A1 | 11/2007 | Xiao et al. |
| 2008/0012535 A1 | 1/2008 | Takatsuji et al. |
| 2009/0202890 A1 | 8/2009 | Takeda et al. |
| 2010/0019729 A1 | 1/2010 | Kaita et al. |
| 2010/0188046 A1 | 7/2010 | Liu et al. |
| 2010/0188047 A1 | 7/2010 | Liu et al. |
| 2010/0244770 A1 | 9/2010 | Yasuhito et al. |
| 2010/0244771 A1 | 9/2010 | Yasuhito et al. |
| 2011/0025277 A1 | 2/2011 | Hussain et al. |
| 2011/0298425 A1 | 12/2011 | Liu et al. |

FOREIGN PATENT DOCUMENTS

| | | |
|---|---|---|
| JP | H 07-49731 | 2/1995 |
| JP | H 07-79535 | 3/1995 |
| JP | H 07-087673 | 3/1995 |
| JP | H 07-107676 | 4/1995 |
| JP | H 07-27256 | 5/1995 |
| JP | H 07-203634 | 8/1995 |
| JP | H 07-230344 | 8/1995 |
| JP | H 07-241040 | 9/1995 |
| JP | H 07-241044 | 9/1995 |
| JP | H 07-254440 | 10/1995 |
| JP | H 07-274403 | 10/1995 |
| JP | H 10-509579 | 9/1998 |
| JP | H 10-341535 | 12/1998 |
| JP | 2000-294298 | 10/2000 |
| JP | 2002-010501 | 1/2002 |
| JP | 2002-042901 | 2/2002 |
| JP | 2003-174738 | 6/2003 |
| JP | 2003-209932 | 7/2003 |
| JP | 2003-219572 | 7/2003 |
| JP | 2005-287136 | 10/2005 |
| JP | 2006-238619 | 9/2006 |
| JP | 2006-345660 | 12/2006 |
| JP | 2007-221992 | 8/2007 |
| JP | 2007-234434 | 9/2007 |
| JP | 2008-016230 | 1/2008 |
| JP | 2008-235032 | 10/2008 |
| JP | 2009-193720 | 8/2009 |
| JP | 2010-035280 | 2/2010 |
| JP | 2012-506144 | 4/2014 |
| KR | 10-0525340 | 12/2005 |
| KR | 10-2006-0094897 | 8/2006 |
| KR | 10-2007-0064244 | 6/2007 |
| KR | 10-2007-0095612 | 10/2007 |
| WO | WO 99/28808 | 6/1999 |
| WO | PCT/US2010/030959 | 11/2010 |
| WO | PCT/US2010/030959 | 10/2011 |

* cited by examiner

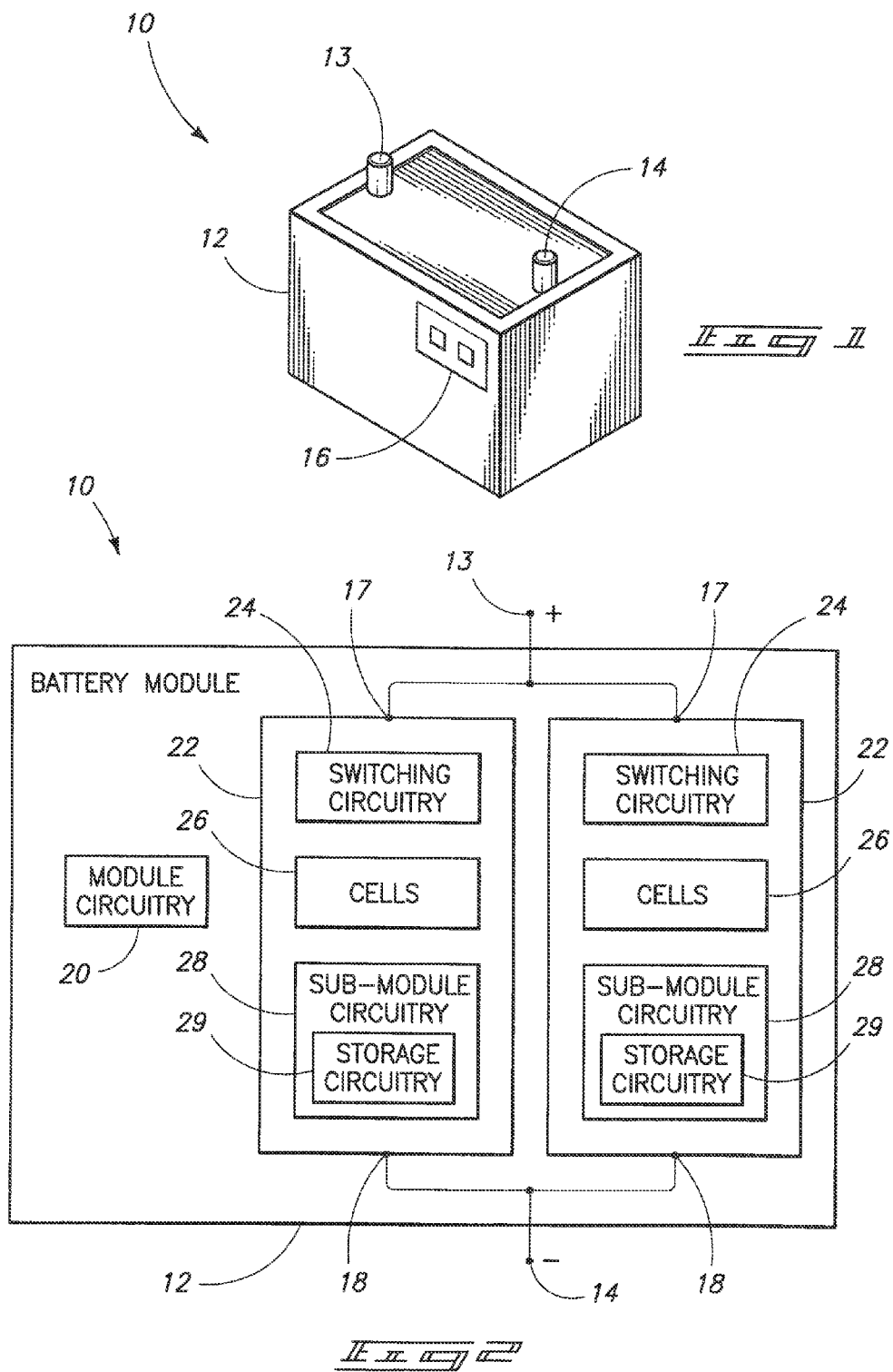

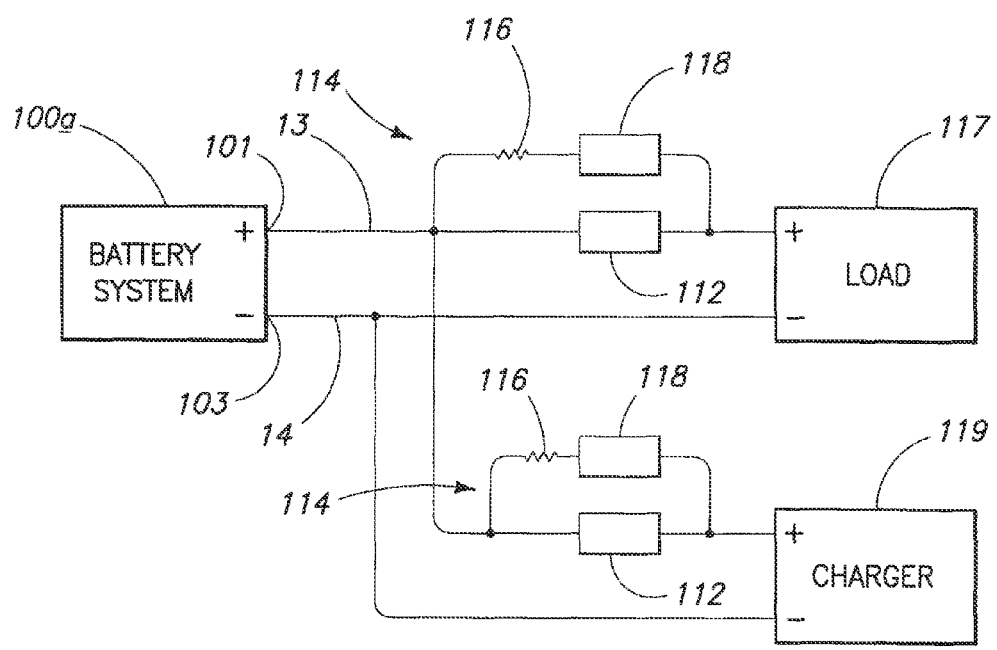

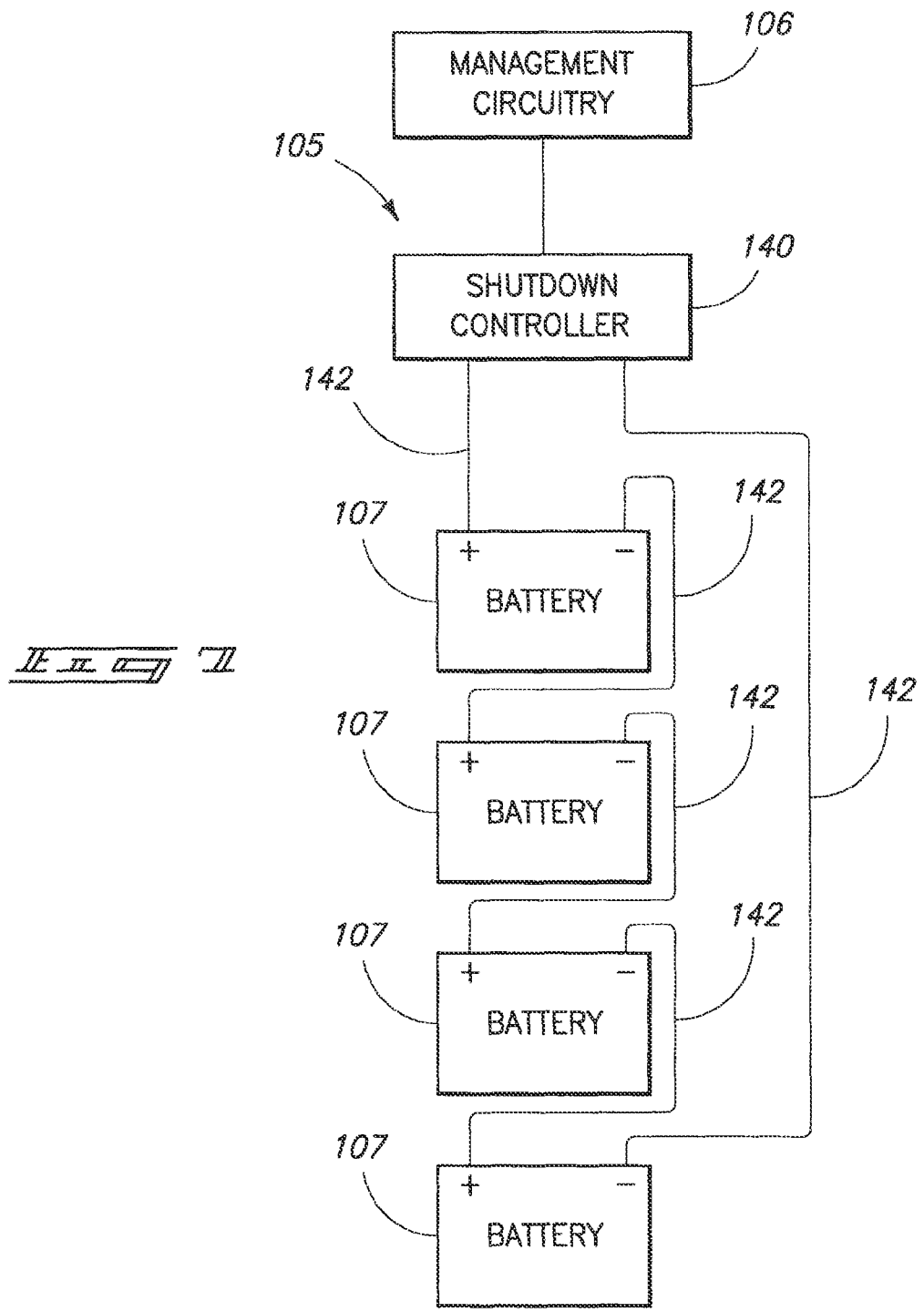

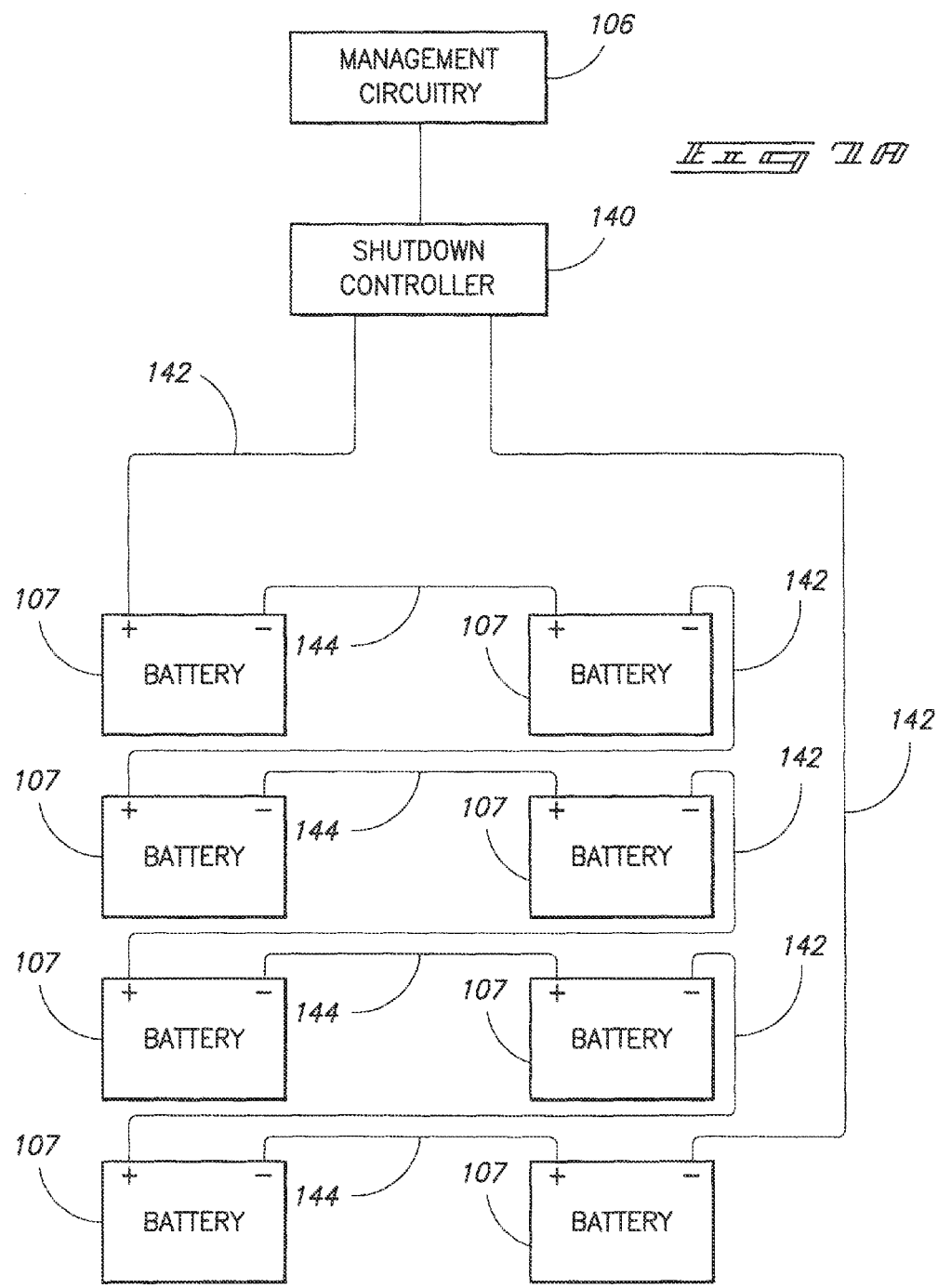

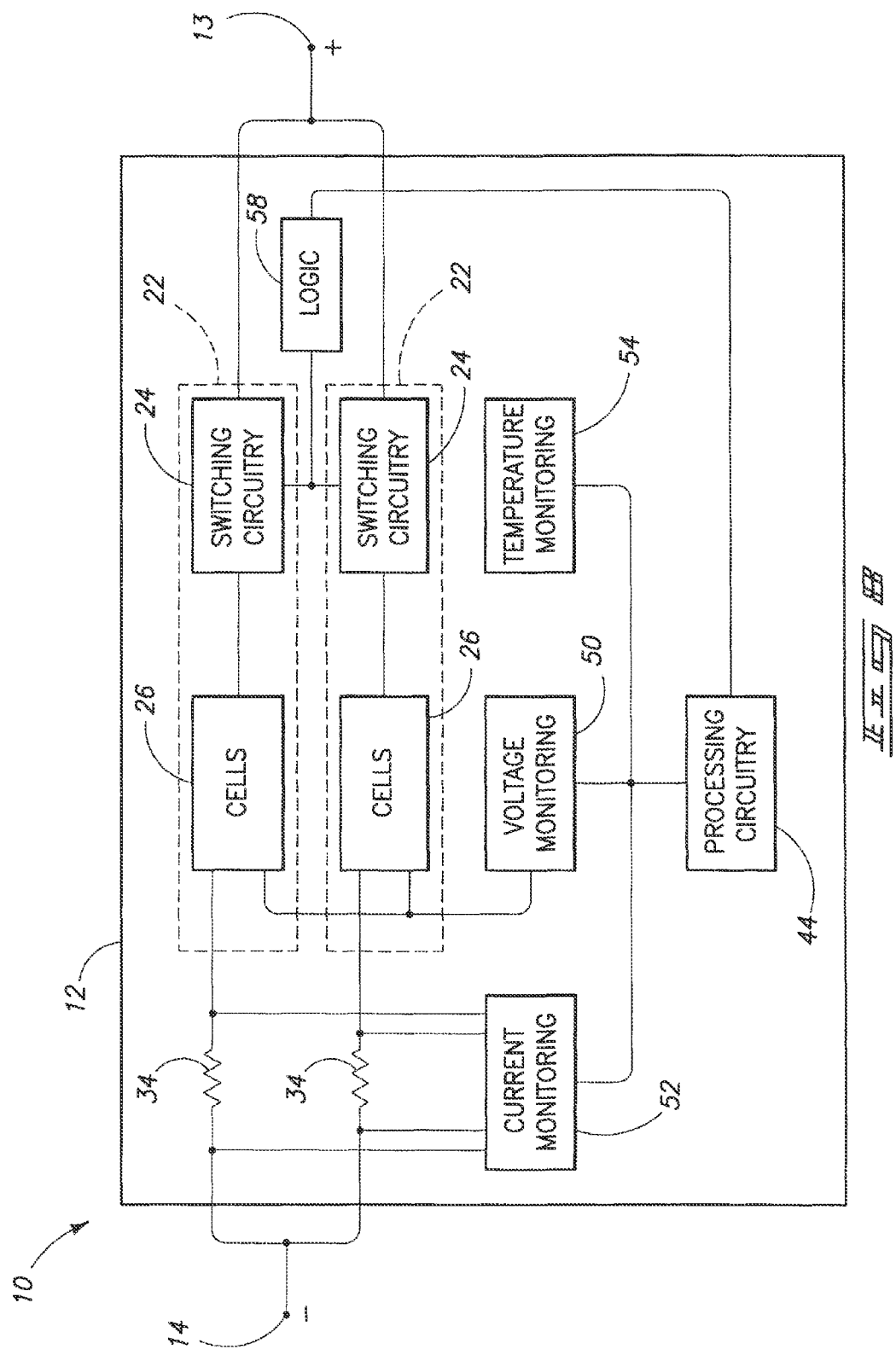

BATTERIES, BATTERY SYSTEMS, BATTERY SUBMODULES, BATTERY OPERATIONAL METHODS, BATTERY SYSTEM OPERATIONAL METHODS, BATTERY CHARGING METHODS, AND BATTERY SYSTEM CHARGING METHODS

This application claims the benefit of Provisional application Ser. No. 61/170,061, filed 16 Apr. 2009.

TECHNICAL FIELD

This disclosure relates to batteries, battery systems, battery submodules, battery operational methods, battery system operational methods, battery charging methods, and battery system charging methods.

BACKGROUND OF THE DISCLOSURE

Rechargeable batteries are being designed for and used in varied applications with different requirements for electrical energy. The rechargeable battery systems comprise rechargeable cells which receive electrical energy during charging operations and supply electrical energy to a load during discharging operations. Rechargeable cells may have different chemistries and may include Lithium Ion cells in one example. The number of rechargeable cells used in different applications is varied depending upon the requirements of the load, and the number of cells may be numerous in some implementations, for example, transportation implementations.

Some rechargeable cells may be subject to failure in the field. The failure may render not only the individual cell inoperable but may also render other cells of the battery inoperable even though the other cells may not have failed. The number of cells which are inoperable may reach a point where the battery fails or is otherwise unable to meet the demands of the load. Depending upon the configuration of the battery, replacement of the inoperable cell(s) may not be possible rendering the battery inoperable.

Aspects of the present disclosure described herein are directed to improved rechargeable batteries, battery systems, and electrical energy storage and supply methods.

BRIEF DESCRIPTION OF THE DRAWINGS

Exemplary embodiments of the disclosure are described below with reference to the following accompanying drawings.

FIG. 1 is an isometric view of a battery module according to one embodiment.

FIG. 2 is a functional block diagram of a battery module according to one embodiment.

FIG. 6 is a functional block diagram of a battery system coupled with a load and a charger in one embodiment.

FIG. 7 is a functional block diagram of circuit components and batteries of a battery system according to one embodiment.

FIG. 7a is a functional block diagram of circuit components and batteries of a battery system according to one embodiment.

FIG. 8 is a functional block diagram of circuitry of a battery module according to one embodiment.

DETAILED DESCRIPTION OF EXAMPLE EMBODIMENTS

Figure 3:
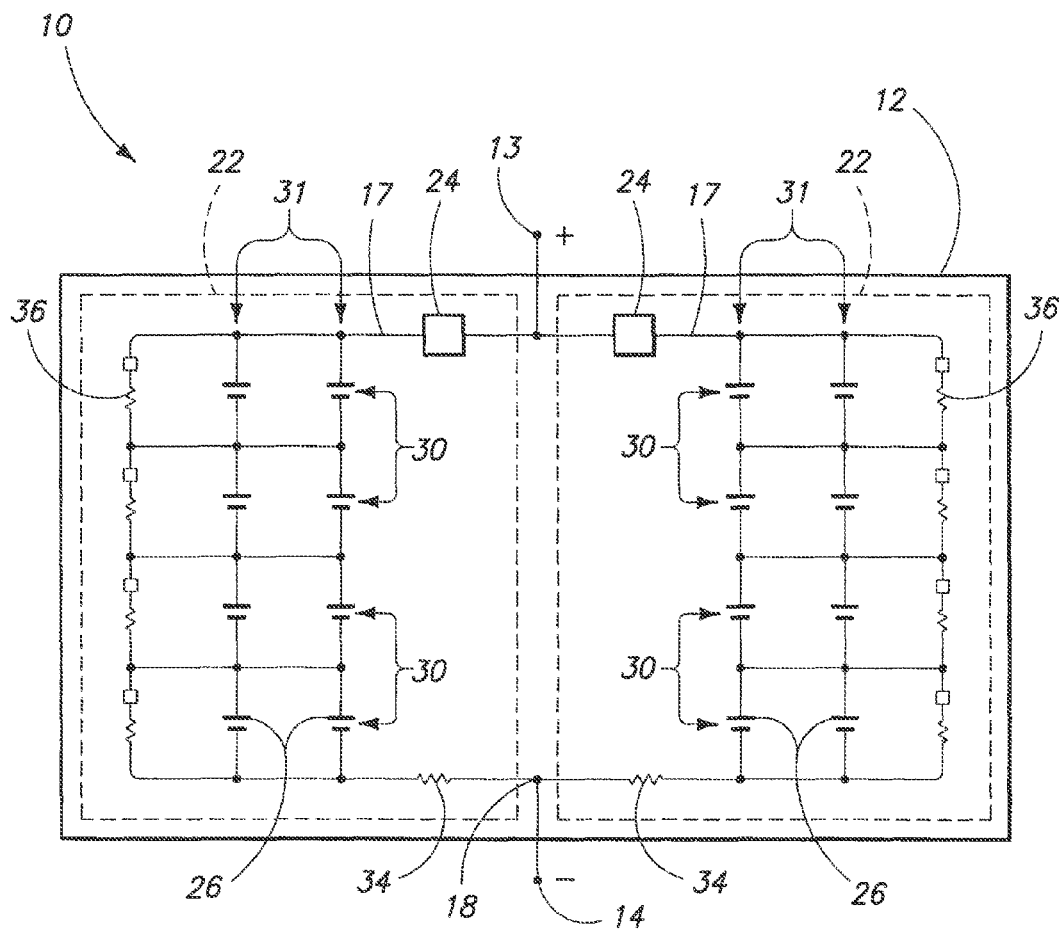
FIG. 3 is an illustrative circuit schematic of a battery module according to one embodiment.

This disclosure of the invention is submitted in furtherance of the constitutional purposes of the U.S. Patent Laws "to promote the progress of science and useful arts" (Article 1, Section 8).

As described below, various embodiments provide rechargeable battery modules, rechargeable battery submodules, and rechargeable battery systems (which may selectively operate in engaged or disengaged modes of operation) as well as associated methods. During an engaged mode of operation, rechargeable cells of the battery modules, battery submodules, or battery systems are configured to receive electrical energy from and/or supply electrical energy to an external device, such as a charger or a load. During a disengaged mode of operation, rechargeable cells of the battery modules, battery submodules, or battery systems are electrically isolated from the external device(s) and accordingly are not configured to receive electrical energy and/or supply electrical energy. Accordingly, some embodiments described herein may provide improved operations in some implementations by isolating failed components of the battery system, battery module, or battery submodule in a disengaged mode of operation while other properly operating components may remain in an engaged mode of operation.

According to one embodiment, a battery comprises a first battery terminal, a second battery terminal, and a plurality of submodules individually comprising a first submodule terminal, a second submodule terminal, a plurality of rechargeable cells electrically coupled between the first and second submodule terminals, and switching circuitry configured to electrically couple one of the first and second battery terminals with one of the first and second submodule terminals of one of the submodules during an engaged mode of operation of the one of the submodules and to electrically isolate the one of the first and second battery terminals from the one of the first and second submodule terminals of the one of the submodules during a disengaged mode of operation of the one of the submodules.

According to another embodiment, a battery comprises a first battery terminal, a second battery terminal, and a plurality of submodules individually comprising a plurality of rechargeable cells electrically coupled between the first and second battery terminals, and wherein the submodules are individually configured to operate in an engaged mode of operation wherein the rechargeable cells of the individual submodule at least one of supply and receive electrical energy with respect to the first and second battery terminals and to operate in a disengaged mode of operation wherein the rechargeable cells of the individual submodule do not supply nor receive electrical energy with respect to the first and second battery terminals.

According to yet another embodiment, a battery system comprises a first system terminal, a second system terminal, a plurality of battery strings coupled in parallel between the first system terminal and the second system terminal, wherein individual ones of the battery strings comprise a plurality of rechargeable batteries coupled in series between the first system terminal and the second system terminal, and wherein individual ones of the battery strings are configured to operate in an engaged mode of operation where the individual battery string is electrically coupled with the first and second system terminals and configured to at least one of supply and receive electrical energy with respect to the first and second system terminals and a disengaged mode of operation where the individual battery string is configured to not supply nor receive electrical energy with respect to the first and second system terminals.

According to still another embodiment, a battery comprises a first battery terminal, a second battery terminal, and a plurality of submodules individually comprising a plurality of rechargeable cells electrically coupled between the first and second battery terminals and wherein the rechargeable cells receive charging electrical energy from at least one of the first and second battery terminals, and control circuitry configured to monitor the rechargeable cells of the submodules and to use the monitoring to control the application of different amounts of the charging electrical energy to the rechargeable cells of different ones of the submodules.

According to still another embodiment, a battery system comprises a first system terminal, a second system terminal, a plurality of rechargeable batteries coupled with the first and second system terminals and configured to supply electrical energy to a load coupled with the first and second system terminals and to receive electrical energy from a charger coupled with the first and second system terminals to charge the rechargeable batteries, and control circuitry configured to monitor individual ones of the rechargeable batteries and to control an amount of electrical energy supplied to at least one of the rechargeable batteries using the monitoring.

According to still another embodiment, a battery comprises a first battery terminal, a second battery terminal, and a plurality of rechargeable cells electrically coupled between the first and second battery terminals, and switching circuitry configured to control an amount of electrical energy conducted with respect to the rechargeable cells during electrical connection of the rechargeable cells to an external device from a state where the rechargeable cells and the external device are not electrically connected.

According to yet another embodiment, a battery system comprises a plurality of rechargeable cells, first contactor circuitry configured to selectively electrically couple the rechargeable cells with an external device during an engaged mode of operation of the first contactor circuitry and to electrically isolate the rechargeable cells from the external device in a disengaged mode of operation of the first contactor circuitry, and second contactor circuitry configured to selectively electrically couple the rechargeable cells with the external device in an engaged mode of operation of the second contactor circuitry and to electrically isolate the rechargeable cells from the external device in a disengaged mode of operation of the second contactor circuitry, and wherein the second contactor circuitry operating in the engaged mode of operation is configured to conduct a reduced amount of current compared with an amount of current conducted through the first contactor circuitry operating in the engaged mode of operation.

According to yet another embodiment, a battery comprises a first battery terminal, a second battery terminal, and a plurality of submodules individually comprising a plurality of rechargeable cells electrically coupled between the first and second battery terminals, and wherein the submodules individually comprise storage circuitry configured to store information with respect to at least one of charging and discharging of the rechargeable cells of the respective individual submodule.

According to another additional embodiment, a battery submodule comprises a first submodule terminal, a second submodule terminal, a plurality of rechargeable cells electrically coupled between the first and second submodule terminals, and storage circuitry configured to store information with respect to the rechargeable cells.

According to another additional embodiment, a battery system comprises a first system terminal, a second system terminal, a plurality of battery strings coupled in parallel between the first system terminal and the second system terminal, wherein individual ones of the battery strings comprise a plurality of rechargeable batteries coupled in series between the first system terminal and the second system terminal, wherein the batteries of an individual one of the battery strings are coupled in series at a plurality of nodes intermediate respective ones of the batteries of the individual battery string, and wherein the nodes of a first of the battery strings are coupled with the nodes of a second of the battery strings to electrically couple the batteries of the first of the battery strings in parallel with respective ones of the batteries of the second of the battery strings.

According to another additional embodiment, a battery system comprises a first system terminal, a second system terminal, a plurality of rechargeable batteries coupled with the first and second system terminals, wherein the rechargeable batteries individually comprise a plurality of rechargeable cells configured to receive electrical energy from the first and second system terminals during charging operations of the individual rechargeable battery and to supply electrical energy to the first and second system terminals during discharging operations of the individual rechargeable battery, and processing circuitry configured to implement at least one operation for the individual rechargeable battery with respect to at least one of the charging operations and discharging operations of the individual rechargeable battery, and management circuitry configured to communicate with the processing circuits of the rechargeable batteries.

According to still another additional embodiment, a battery operational method comprises conducting electrical energy with respect to a plurality of rechargeable cells of a plurality of submodules of a battery during operations of respective individual ones of the submodules in an engaged mode of operation, and changing one of the submodules to a disengaged mode of operation wherein electrical energy is not conducted with respect to the rechargeable cells of the one of the submodules.

According to still another additional embodiment, a battery operational method comprises electrically coupling a plurality of rechargeable cells of a plurality of submodules with a terminal which is coupled with an external device at a first moment in time, conducting electrical energy between the external device and the rechargeable cells of the submodules during the electrically coupling, and electrically isolating the rechargeable cells of one of the submodules from the terminal at a second moment in time.

According to still another additional embodiment, a battery system operational method comprises conducting electrical energy between a battery system comprising a plurality of strings of rechargeable batteries and an external device which is coupled with a terminal of the battery system during an engaged mode of operation of the strings of the batteries, and wherein the strings of the batteries are coupled in parallel with one another at the terminal and individual ones of the strings of batteries comprise a plurality of rechargeable batteries coupled in series with the terminal, and operating one of the strings of batteries in a disengaged mode of operation where electrical energy is not conducted between the batteries of the one of the strings of batteries and the external device.

According to still another additional embodiment, a battery charging method comprises supplying charging electrical energy via a terminal to a plurality of rechargeable cells of a plurality of submodules of a battery to electrically charge the rechargeable cells, monitoring the rechargeable cells of the submodules of the battery during the supplying, and using the monitoring, applying different amounts of the charging electrical energy to the rechargeable cells of different ones of the submodules of the battery.

According to still another additional embodiment, a battery system charging method comprises supplying electrical energy to electrically charge a plurality of rechargeable batteries of a battery system, monitoring the rechargeable batteries of the battery system during the supplying, and using the monitoring, controlling an amount of the electrical energy supplied to at least one of the rechargeable batteries.

According to still another additional embodiment, a battery operational method comprises operating switching circuitry of a plurality of submodules of a battery in conducting states during an engaged mode of operation of the submodules to electrically couple a plurality of rechargeable cells of the submodules with an external device at one moment in time, operating the switching circuitry of at least one of the submodules in a non-conducting state during a disengaged mode of operation of the at least one of the submodules to electrically isolate the rechargeable cells of the at least one of the submodules from the external device at an other moment in time, changing the operation of the at least one of the submodules from the disengaged mode of operation to the engaged mode of operation, and using the switching circuitry of the at least one of the submodules, limiting an amount of the electrical energy conducted with respect to the rechargeable cells of the at least one of the submodules during the changing.

According to still another additional embodiment, a battery system operational method comprises storing electrical energy using a plurality of rechargeable cells of a battery system, using contactor circuitry, electrically conducting electrical energy between the rechargeable cells and an external device during charging and discharging of the rechargeable cells during an engaged mode of operation of the battery system, using the contactor circuitry, electrically isolating the rechargeable cells and the external device during a disengaged mode of operation of the battery system, changing the mode of the operation of the battery system from the disengaged mode of rechargeable batteries, and using management circuitry of the battery system, communicating with the processing circuits of the rechargeable batteries.

Referring to FIG. 1, a battery, also referred to a battery module, is shown with respect to reference 10. Battery module 10 includes a housing 12 and first and second battery terminals 13, 14 provided at different voltages (e.g., battery terminal 14 may be at a ground potential and battery terminal 13 may be at a voltage above ground in one example).

A plurality of rechargeable cells (not shown in FIG. 1) is housed within housing 12 in one embodiment. The rechargeable cells may comprise Lithium Ion cells in one embodiment. These cells individually provide a voltage of approximately 3.2 Volts in an operational state. Other rechargeable cells may be used in other embodiments.

The number of rechargeable cells housed within housing 12 may be varied in different configurations of battery module 10 and may be coupled in series and/or parallel to meet the electrical energy requirements of the load. In illustrative examples, battery module 10 is configured to provide 12.9 or 19.2 Volts between terminals 13, 14. Other arrangements of battery module 10 are possible.

Figure 5:
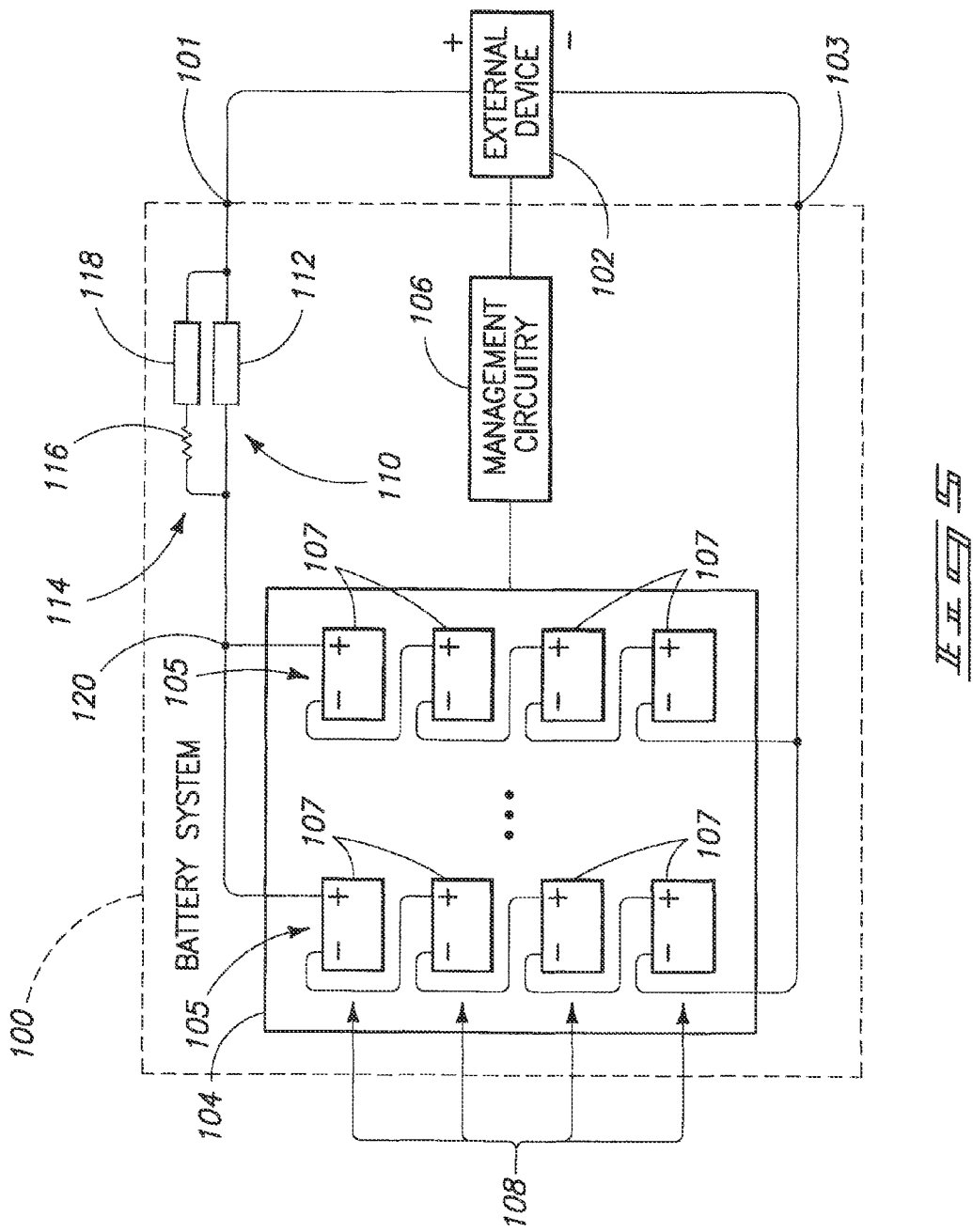
FIG. 5 is a functional block diagram of a battery system according to one embodiment.

The depicted battery module 10 includes interface circuitry 16 which is configured to implement communications between battery module 10 and external devices (not shown). For example, battery module 10 may communicate with external devices such as a load and/or charger in some embodiments. In other examples, battery module 10 may be used with one or more other battery modules 10 in a battery system (e.g., one example battery system is shown in FIG. 5) and interface circuitry 16 may be configured to implement communications within the battery system as discussed in further detail below. For example, the battery module 10 may communicate with other battery modules 10 and/or management circuitry of the battery system as described below in illustrative embodiments.

Referring to FIG. 2, additional details of one configuration of battery module 10 are shown. The illustrated battery module 10 includes module circuitry 20 and a plurality of submodules 22 which may also be referred to as battery submodules 22. Two submodules 22 are depicted in the example of FIG. 2 for discussion purposes although other battery modules 10 may include only one submodule 22 or additional submodules 22. Submodules 22 are coupled in parallel with one another intermediate first and second battery terminals 13, 14 in the depicted embodiment.

Module circuitry 20 is configured to perform monitoring and/or control of battery module 10 as well as implement communications externally of battery module 10 in one embodiment. Additional details of module circuitry 20 are described below.

Submodules 22 are configured to be individually removable and replaceable with respect to battery module 10 in one embodiment. For example, a submodule 22 may be removed and replaced if cells or circuitry of the submodule 22 becomes defective, for example, during operation. Submodules 22 may have respective housings which contain the switching circuitry 24, cells 26, and submodule circuitry 28 of the respective submodules 22. If a submodule 22 is defective or nonoperational, the entire submodule 22 may be provided in a disengaged mode of operation (discussed further below), removed from the battery module 10, and replaced with another properly functioning submodule 22 in one embodiment.

Individual submodules 22 include first and second submodule terminals 17, 18, switching circuitry 24, a plurality of rechargeable cells 26, and submodule circuitry 28 in the illustrated embodiment. First and second submodule terminals 17, 18 are provided at different voltage levels and coupled with first and second battery terminals 13, 14, respectively. For example, terminals 13, 14 may correspond to positive and negative references in one embodiment.

In one embodiment, switching circuitry 24 of an individual submodule 22 comprises semiconductor switching circuitry, such as one or more transistors. In one more specific example, one or more charge transistors are coupled in series with one or more discharge transistors in a back-to-back configuration intermediate terminal 13 and cells 26 of the respective individual submodule 22. Due to the presence of a body diode in some configurations of the charge and discharge transistors, the charge and discharge transistors block the flow of current in a single direction in an Off state. Accordingly, in one embodiment, the charge transistor(s) may be arranged so that no electrical energy can flow into the respective submodule 22 when the charge transistor(s) are in an Off state and the discharge transistor(s) may be arranged so that no electrical energy can flow out of the respective submodule 22 when the charge transistor(s) are in an Off state. The number of charge transistors and the number of discharge transistors of the switching circuitry 24 of an individual submodule 22 can be varied depending upon the design of the submodule 22. For example, submodules 22 having higher capacities may have an increased number of charge transistors (coupled in parallel with one another) and an increased number of discharge transistors (coupled in parallel with one another) compared with other submodules 22 having less capacity.

The switching circuitry 24 implemented as semiconductor switching circuitry may be biased at different conductive states to control an amount of electrical energy flowing into or out of the rechargeable cells 26 of the respective submodule 22. Other configurations of switching circuitry 24 to selectively electrically couple the cells 26 with terminal 13 are possible.

Submodule 22 is configured to operate in an engaged operational mode and a disengaged operational mode at different moments in time. One or both of the charge and discharge transistors of switching circuitry 24 are provided in a closed configuration which electrically couples the cells 26 with terminal 17 (permitting charging and/or discharging of cells 26) during the engaged mode of operation. Accordingly, during the engaged mode of operation of a submodule 22, cells 26 of the submodule 22 are configured to receive electrical energy from battery terminals 13, 14 for charging the respective cells 26 of the submodule 22 and/or to supply electrical energy to terminals 13, 14 during discharging operations of the respective cells 26 of the submodule 22. Switching circuitry 24 is in an open configuration (e.g., both of the charge and discharge transistors are open) which electrically isolates the cells 26 from the terminal 17 (no charging or discharging of cells 26) during the disengaged mode of operation.

Submodules 22 are configured in some embodiments to operate independently of one another in the engaged and disengaged modes of operation. For example, one or more submodules 22 of a battery module 10 may operate in the engaged mode of operation (with charge and/or discharge transistors of the respective switching circuitry 24 "On" or in conducting states) while another of the submodules 22 of the battery module 10 operates in a disengaged mode of operation (with charge and discharge transistors of the respective switching circuitry 24 "Off" or in non-conducting states). Accordingly, in one embodiment, a battery module 10 is configured to operate in a plurality of different modes at different moments in time wherein different numbers of rechargeable cells 26 are configured to supply electrical energy to a load or receive charging electrical energy from a charger.

As described herein, different portions of a battery module 10 (or battery system 100 for example described below in FIG. 5) may be controlled to be independently provided in the engaged or disengaged modes of operation. The switching circuitry 24 of the submodules 22 may be individually opened or closed to provide respective ones of the submodules 22 in the disengaged or engaged modes of operation. In the presence of a system shutdown, the switching circuitry 24 of all of the submodules 22 may be opened to provide all of the submodules 22 in the disengaged mode of operation. Accordingly, the submodules 22 of a single battery module 10 or a plurality of battery modules 10 of a battery system may be provided in the disengaged mode of operation. In addition, for arrangements including one battery module 10, the switching circuitry 24 of submodules 22 of the single battery module 10 may be opened if the single battery module 10 is to be provided in the disengaged mode of operation. For arrangements including plural battery modules 10, one battery module 10 may be provided in a disengaged mode of operation while other battery modules 10 of the battery system may be in the engaged mode of operation.

As described below, a battery system may include a plurality of battery modules 10 arranged in a plurality of strings. The strings of battery modules 10 may be controlled to independently operate in the engaged and disengaged modes of operation. The switching circuitry 24 of submodules 22 of one string of battery modules 10 may be opened to provide the string of battery modules 10 in the disengaged mode of operation. The switching circuitry 24 of others of the submodules 22 and/or battery modules 10 (perhaps also arranged in other strings of battery modules 10) may be closed providing the others of the submodules 22 and/or battery modules 10 in the engaged mode of operation while some of the submodules 22 or battery modules 10 operate in the disengaged mode of operation. In one specific example, one submodule 22 of a given battery module 10 may be provided in the engaged mode of operation while another submodule 22 of the given battery module 10 is provided in a disengaged mode of operation. In some embodiments, one battery module 10 of a string may be provided in a disengaged mode of operation while one or more other battery modules 10 of the same string are provided in the engaged mode of operation (e.g., described with respect to an example embodiment of FIG. 5A below).

Accordingly, in one embodiment, various portions of a battery module 10 or a battery system (e.g., comprising a plurality of battery modules 10) may be independently operated in engaged or disengaged modes of operation. Control of operation between engaged and disengaged modes of operation may be implemented at the submodule level, battery module level, string of batteries level, and/or entire battery system level in example embodiments. Furthermore, a battery module 10 or battery system may have different numbers of cells 26 configured to receive or supply electrical energy at different moments in time based upon how many cells 26 are operating in the engaged or disengaged modes of operation at the different moments in time. If a given battery module 10 has two submodules 22, and only one of the submodules 22 is in the disengaged mode of operation at a given moment in time, the capacity of the battery module 10 would be reduced to half if the submodules 22 contained the same number and arrangement of cells 26.

As discussed above, the submodules 22 operate in the engaged mode of operation during normal operation of the battery module 10 to supply and/or receive electrical energy. However, it may be desirable for one or more of the submodules 22 to operate in a disengaged mode of operation for various reasons. For example, an internal cell 26 of a submodule 22 may be defective or faulty during operations of the battery module 10 and it may be desirable to provide the submodule 22 with the defective cell 26 in the disengaged mode of operation to protect battery module 10, a battery system (if present), a load, and/or other circuitry. In one embodiment, a submodule 22 provided in the disengaged mode of operation may be removed and perhaps replaced in battery module 10. Thereafter, the new, serviced, or replacement submodule 22 provided in the battery module 10 may operate in the engaged mode of operation. Furthermore, in one embodiment, other submodules 22 of the battery module 10 may continue to operate in the engaged mode of operation during the operation of the submodule 22 in the disengaged mode of operation.

In another example, the battery module 10 may receive a command from external of the battery module 10 which requests all submodules 22 of the battery module 10 to operate in the disengaged mode of operation and the submodules 22 of the battery module 10 may be controlled to operate in the disengaged mode of operation responsive to receiving the request. The command may be generated responsive to an alarm condition occurring external of the battery module 10 (e.g., in some other component of a battery system) from the load, or from the charger in illustrative examples. Accordingly, one or more submodule 22 may be controlled to operate in a disengaged mode of operation responsive to an alarm condition being present externally of the one or more submodule 22 in one embodiment.

In one embodiment, configuring the submodules 22 to selectively operate in the engaged and disengaged modes of operation provides a flexible implementation of the battery module 10 which may continue to operate even in the presence of one or more failed or defective cell 26. In particular, if one or more cell 26 of an individual submodule 22 is defective (or it is otherwise desirable to disable the individual submodule 22), the switching circuitry 24 of the individual submodule 22 may be opened providing the individual submodule 22 in the disengaged mode of operation while the other submodule(s) 22 of the battery module 10 continue to operate in the engaged mode of operation. The capacity of the battery module 10 is reduced if one or more submodule 22 is provided in the disengaged mode of operation but with the benefit that the battery module 10 can continue to operate in an engaged mode of operation where at least one battery submodule 22 is operating in the engaged mode of operation. The battery module 10 may be considered to be in a disengaged mode of operation when no submodules 22 of the battery module 10 are operating in the engaged mode of operation. Furthermore, a battery system may be considered to be in the disengaged mode of operation when no battery modules 10 of the system operate in the engaged mode of operation.

Rechargeable cells 26 may be arranged in a series string intermediate the submodule terminals 17, 18 to provide a desired voltage (e.g., four of the above described 3.2 V cells in series provide a voltage of 12.8 V). Other numbers of cells 26 may be coupled in series in other embodiments (e.g., 2-24 cells 26 in series in example embodiments). Furthermore, a plurality of the series strings of cells 26 may be coupled in parallel between the submodule terminals 17, 18 to provide a desired capacity. In one example, forty-five strings of cells 26 are coupled in parallel in a submodule 22. Other numbers of strings may be provided within a submodule 22 in other embodiments.

Submodule circuitry 28 comprises storage circuitry 29 in one embodiment as discussed in additional detail below. Storage circuitry 29 is configured to store information regarding the respective individual submodule 22 in one embodiment. The storage circuitry 29 may be configured to store information with respect to charging and discharging of the battery module 10 in one embodiment. For example, the storage circuitry 29 may store information regarding a configuration of the submodule 22 (e.g., number and layout of cells 26) and history information regarding past use of the submodule 22. Storage circuitry 29 may be implemented as appropriate memory configured to retain stored information for subsequent retrieval.

In one embodiment, the configuration information stored within storage circuitry 29 may comprise information to facilitate use of the respective submodule 22 within a battery module 10 (e.g., upon replacement of a defective submodule 22 in the battery module 10). The configuration information may be used by processing circuitry 44 (discussed below with respect to FIG. 4) to control or implement at least one operation with respect to the respective submodule 22. For example, the processing circuitry 44 may use the configuration information to implement charging and/or discharging of the individual submodule 22. In one embodiment, the storage circuitry 29 may comprise configuration information regarding a chemistry composition of cells 26 contained within the submodule 22, and for example, may specify a desired charging current for charging of cells 26 of the submodule 22 and a desired voltage range of the cells 26 in a substantially charged state. Storage circuitry 29 may comprise configuration information regarding the number of cells 26, banks 30, and strings 31 (described with respect to one example in FIG. 3) contained within the submodule 22 and information regarding taps or ports for use in monitoring the respective submodule 22 by module circuitry 20 upon installation of the submodule 22 in the respective battery module 10.

The storage circuitry 29 may also include historical information regarding a history of past use of the submodule 22. For example, historical information with respect to charging and/or discharging of the submodule 22 may be stored. In one embodiment, one or more operational parameter such as electrical characteristics (e.g., voltage, charging and/or discharging current, state of charge, etc.) of the submodule 22 may be stored at different moments in time during the use of the submodule 22. In one embodiment, temporal information regarding the use of the submodule 22 may be stored. For example, date and time information may be stored which corresponds to the information stored regarding the electrical characteristic(s). The temporal information may also be stored to indicate the length of time the submodule 22 has been in use.

More specific examples of historical information which may be stored include the number of charge and/or discharge cycles of the submodule 22, the state of charge or discharge of the submodule 22, and a number of alarm conditions or events present during use of the submodule 22 (e.g., where recommended thresholds of the submodule 22 have been exceeded during use). This information illustrates some types of information which may be recorded for subsequent retrieval. Other information regarding the submodule 22 may also be recorded. The stored or recorded information may be used by a manufacturer of the submodule 22 (or any other appropriate entity) to determine the use that the submodule 22 has been subjected to, for example, for warranty purposes. A submodule 22 may be returned from a customer to the manufacturer who may access the recorded information to attempt to determine cause of failure of the submodule 22.

In addition to storage circuitry 29, submodule circuitry 28 may include interface circuitry (not shown) in one embodiment to communicate with module circuitry 20. Submodule circuitry 28 may include appropriate interconnects or taps (not shown) to permit external circuitry to monitor electrical characteristics of submodules 22 (e.g., the voltages of cells 26, current flowing with respect to submodules 22, etc.). Submodule circuitry 28 may also include temperatures sensing devices and associated interconnects to monitor temperatures of the submodule 22 during use.

Figure 4:
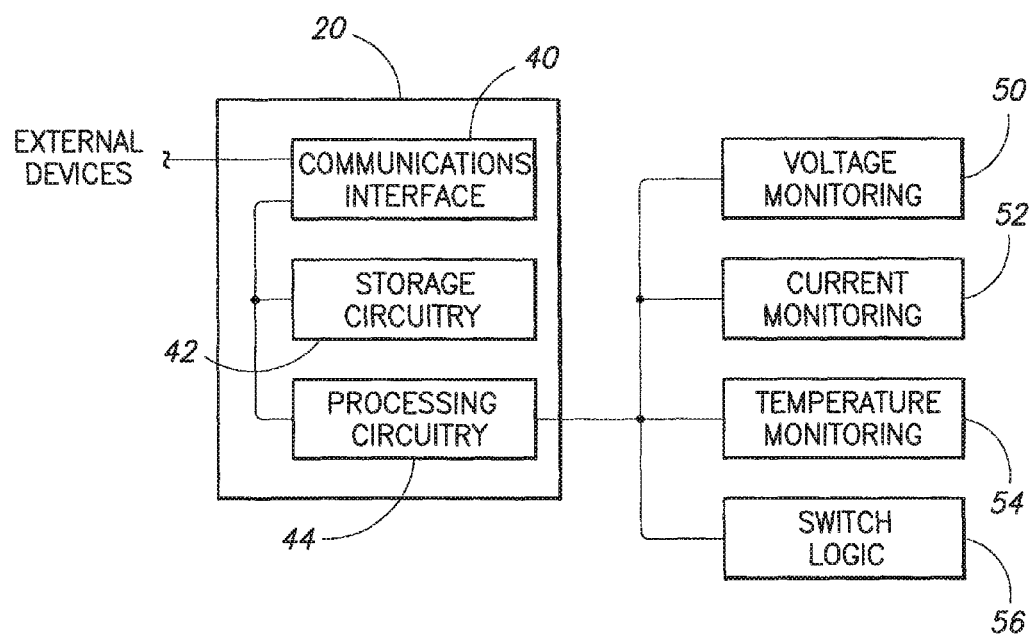
FIG. 4 is a functional block diagram of circuitry of a battery module according to one embodiment.

Referring to FIG. 3, additional details regarding one configuration of a battery module 10 including two submodules 22 is shown according to one embodiment. The submodules 22 include a plurality of strings 31 of cells 26 coupled intermediate submodule terminals 17, 18. Two strings 31 are shown in the configuration of FIG. 3 although other numbers of strings 31 of cells 26 are possible in other embodiments. Cells 26 of the strings 31 which are coupled in parallel with one another may be referred to as being in a bank 30 of cells 26. As discussed above, switching circuitry 24 may be controlled to provide a respective submodule 22 in engaged and disengaged modes of operation by selectively coupling and isolating, respectively, the strings 31 of cells 26 of the respective submodule 22 with respect to battery terminal 13.

The submodules 22 include a resistor 34 coupled between the respective cells 26 of the submodule 22 and the submodule terminal 18. The voltage of resistor 34 may be monitored to determine an amount of current flowing into the submodule 26 during charging operations or output from the submodule 26 during discharging operations.

The depicted submodules 22 also include a plurality of balancing circuits 36 coupled in parallel with banks 30 of cells 26. During charging operations, the cells 26 are charged using electrical energy received via terminals 13, 14. However, individual cells 36 may be charged at different rates due to differences between the cells 26 (e.g., manufacturing tolerances of the cells 26). Balancing circuits 36 are provided to reduce differences of voltages between different banks 30 of cells 26. The individual balancing circuits 36 include a transistor coupled in series with a resistor across a respective bank 30 of cells 26. The transistors are configured to be open until a bank 30 of cells 26 reaches a threshold voltage which may correspond to a voltage of a fully charged cell 26. Upon reaching the threshold voltage, the transistor of the respective balancing circuit 36 conducts which shunts current around the respective bank 30 of cells 26. The shunting of the balancing circuit 36 operates to reduce or stop charging of the respective bank 30 of cells 26. Other banks 30 of cells 26 not at the electronic, magnetic, optical, electromagnetic, infrared or semiconductor media. Some more specific examples of processor-usable media include, but are not limited to, a portable magnetic computer diskette, such as a floppy diskette, zip disk, hard drive, random access memory, read only memory, flash memory, cache memory, and/or other configurations capable of storing programming, data, or other digital information.

In one embodiment, processing circuitry 44 is arranged to process data, control data access and storage, issue commands, and control other desired operations. Processing circuitry 44 may be configured to control operations of battery module 10, for example with respect to charging and/or discharging of battery module 10. For example, the processing circuitry 44 may control the switching circuitry 24 of the respective submodules 22 to electrically isolate the cells 26 of a submodule 22 from the terminals 13, 14 during the disengaged mode of operation of the submodule 22 (or battery module 10) or to electrically couple the cells 26 of the submodule 22 with the terminals 13, 14 during the engaged mode of operation of the submodule 22 and battery module 10.

Processing circuitry 44 may be configured to monitor operations of battery module 10. For example, processing circuitry 44 may monitor operational parameters such as electrical characteristics (e.g., voltage, current, state of charge) of cells 22 of the submodules 22 of the battery module 10 and temperature information and control storage of data regarding the monitoring using storage circuitry 29 and/or 42. For example, processing circuitry 44 may control the storage of historical information of a submodule 22 using storage circuitry 29 of the submodule 22 as discussed above.

Processing circuitry 44 may be configured to access information from storage circuitry 29 of a submodule 22. For example, processing circuitry 44 may access configuration information, for example discussed above, which specifies a configuration of a submodule 22 utilized in the battery module 10. In one embodiment, processing circuitry 44 may use the configuration information to access information regarding a submodule 22 which is inserted into a battery module 10 to replace a defective submodule 22.

Processing circuitry 44 may also be configured to communicate with other circuitry, such as other processing circuits 44 of other battery modules 10 employed in a common battery system 100 described below, management circuitry 106 of the battery system 100 described below, and/or other devices. As described further below, processing circuitry 44 may be configured to receive commands from externally of the battery module 10 and control the operation of the battery module 10 between an engaged mode of operation and a disengaged mode of operation responsive to the commands. Processing circuitry 44 may also be configured to output status messages to other processing circuits 44 and/or management circuitry 106 and which indicates status information regarding the battery module (e.g., the battery module 10 operating in an engaged or disengaged operational mode, status of electrical characteristics of the battery module 10).

Processing circuitry 44 may comprise circuitry configured to implement desired programming provided by appropriate media in at least one embodiment. For example, the processing circuitry 44 may be implemented as one or more of a processor and/or other structure configured to execute executable instructions including, for example, software and/or firmware instructions, and/or hardware circuitry.

Exemplary embodiments of processing circuitry 44 include hardware logic, PGA, FPGA, ASIC, state machines, and/or other structures alone or in combination with a processor. These examples of processing circuitry are for illustration and other configurations are possible.

At least some embodiments or aspects described herein may be implemented using programming stored within an appropriate medium (e.g., storage circuitry 42 described above) and configured to control appropriate processing circuitry 44. Programming may be provided via any appropriate storage media including, for example, embodied within articles of manufacture.

As mentioned above, processing circuitry 44 is configured to monitor statuses of various operational parameters of submodules 22 and control various operations of submodules 22, including control of operations responsive to the monitoring (e.g., providing a submodule 22 in a disengaged mode of operation responsive to monitoring of the processing circuitry 22 detecting an alarm condition within the submodule 22) in one embodiment. Processing circuitry 44 may also be referred to as control circuitry.

In one embodiment, processing circuitry 44 is coupled with circuitry of the submodule 22 including voltage monitoring circuitry 50, current monitoring circuitry 52, temperature monitoring circuitry 54 (to monitor operational parameters of voltage, current and temperature of the submodule 22 in the described example) and switch logic 56 coupled with the respective switching circuitry 24 of the submodule 22.

Voltage monitoring circuitry 50 is configured to provide status information of voltages of the submodule 22. For example, the voltage monitoring circuitry 50 may provide voltages of individual cells 26 and/or strings 31 of cells 26.

Current monitoring circuitry 52 is configured to provide status information of current flowing into the submodule 22 and/or out of the submodule 22. For example, current monitoring circuitry may include resistor 34 of FIG. 3 in one embodiment.

The temperature monitoring circuitry 54 may include one or more thermistors or other appropriate circuitry to provide temperature status information regarding various components or regions of the submodule 22.

In one embodiment, processing circuitry 44 may monitor for the presence of alarm conditions during operation of the respective battery module 10. For example, processing circuitry 44 may monitor operational parameters (e.g., electrical characteristics, temperature) with respect to respective thresholds and indicate an alarm condition responsive to the operational parameters triggering a threshold. For example, processing circuitry 44 may monitor voltages of cells 26 of submodule 22 to be within a desired range (e.g., a range of 2 Volts-3.8 Volts for each cell 26) and may indicate an alarm condition if the voltage of one or more cell 26 triggers a threshold (i.e., indicating that the voltage of one or more cells 26 is below or exceeds the desired range). Similarly, processing circuitry 44 may monitor currents flowing into or out of a submodule 22 with respect to a desired range and may indicate an alarm condition if the currents are below or exceed desired thresholds of the range. Processing circuitry 44 may monitor temperatures of a submodule 22 with respect to a desired range and may indicate an alarm condition if the temperatures are below or exceed desired thresholds of the range.

As discussed further below, processing circuitry 44 of a battery module 10 where an alarm condition is detected may initiate an operation responsive to the alarm condition being present. For example, in one embodiment, processing circuitry 44 may instruct a submodule 22 which experiences an alarm condition to enter the disengaged mode of operation. In another example, the processing circuitry 44 may initiate a shutdown of the respective battery module 10 which includes an alarm condition to enter a disengaged mode of operation. The processing circuitry 44 of the battery module 10 having the alarm condition may inform management circuitry 106 (FIG. 5) of the detection of the alarm condition and which may result in one or more other battery modules 10 of a battery system being provided in the disengaged mode of operation, or perhaps a system shutdown where all of the battery modules 10 of the battery system 10 are provided in a disengaged mode of operation.

Other operations apart from or in addition to shutdown may be implemented in some embodiments. For example, if an out of range temperature is detected, processing circuitry 44 may control fans or other appropriate equipment to bring the temperature internal of the battery module 10 or submodule 22 within an acceptable range. In another example, if an alarm condition is detected with respect to an individual cell 26 (e.g., excessive voltage for the respective cell 26), processing circuitry 44 may control the submodule 44 which contains the cell 26 with the alarm condition to enter a disengaged mode of operation.

Processing circuitry 44 may generate historical information regarding monitored operational parameters and may store the historical status information using storage circuitry 29 of the respective submodule 22 in one embodiment. In one example, processing circuitry 44 controls the storage of values of the various operational parameters (e.g., voltages, currents, charge/discharge cycles, temperature, and state of charge) at different moments in time as well as alarm conditions detected during the monitoring of the operational parameters. In one embodiment, the stored information may be utilized later for warranty purposes to determine the usage of a submodule 22 and perhaps identify any misuse of the submodule 22.

Processing circuitry 44 of a battery module 10 may communicate status information of operational parameters and alarm conditions of the respective battery module 10 to management circuitry of the battery system in one embodiment (management circuitry 106 is shown in FIG. 5 in one embodiment).

Processing circuitry 44 may also use switch logic 56 to control the switching circuitry 24 of the submodule 22, for example, to provide a submodule 22 in engaged or disengaged modes of operation, to limit in-rush of current or provide balanced charging as described below. Switching circuitry 24 may include one or more charge transistor and one or more discharge transistor and the logic 58 may be configured to substantially simultaneously apply substantially the same bias voltage to the one or more charge transistors and to substantially simultaneously apply substantially the same bias voltage to the one or more discharge transistors responsive to respective control signals for the charge transistors and discharge transistors from the processing circuitry 44 in one embodiment.

In one embodiment, it is desired to provide substantially balanced charging of a plurality of submodules 22 of a battery module 10 wherein the cells 26 of the different submodules 22 of the battery module 10 are provided at substantially the same state of charge during charging of the cells 26 of the battery module 10. In one implementation, the processing circuitry 44 may monitor an electrical characteristic of one or more cells 26 of the submodules 22 and may use the monitoring to control an amount of electrical energy applied to the submodules 22 during charging to provide substantially balanced charging of the plurality of submodules 22. In example embodiments, individual cells 26 of a submodule 22 are monitored or the cumulative voltages of the cells 26 of the individual submodules 22 may be monitored. In one embodiment, different amounts of charging electrical energy may be provided to different submodules 22 of a battery module 10 based upon the monitoring of the cells 26 of the submodules 22.

In one example, the processing circuitry 44 may use the voltage monitoring circuitry 50 to monitor the individual and/or cumulative voltages of the cells 26 of the individual submodules 22 during charging operations of cells 26. In one embodiment, the processing circuitry 44 may control the biasing of transistors of switching circuits 24 of the submodules 22 to different conductive states to control the application of different amounts of electrical energy to the submodules 22 to control charging of the cells 26 of the respective submodules 22 responsive to the monitoring of the submodules 22. For example, if the cells 26 of a first submodule 22 of a battery module 10 are charging faster (and have a higher voltage) than the cells 26 of a second submodule 22 of the battery module 10, the processing circuitry 44 may control the biasing of the transistors of the switching circuitry 24 of the first submodule 22 to provide the transistors with increased resistance relative to the resistance of the transistors of the switching circuitry 24 of the second submodule 22 in an attempt to balance the charging of the cells 26 of the respective submodules 22 (i.e., provide the cells 26 of the plural submodules 22 at substantially the same state of charge). More specifically, the switching circuitry 24 of the second submodule 22 would conduct increased charging current relative to the charging current conducted by the switching circuitry 24 of the first submodule 22. The processing circuitry 44 is configured to control the voltages of the cells 26 of the respective submodules 22 by controlling the charging current applied to the respective submodules 22 in one embodiment.

Referring to FIG. 5, one embodiment of a battery system 100 is shown. The depicted battery system 100 includes a plurality of system terminals 101, 103 provided at different voltage levels (e.g., positive and ground). The battery system 100 is configured to be electrically coupled with one or more external device 102, such as a load and/or charger. Battery system 100 is configured to supply electrical energy to a load which is coupled with system terminals 101, 103. In addition, a charger may also be connected with system terminals 101, 103 and configured to supply a charging current for charging the battery system 100.

The illustrated embodiment of the battery system 100 includes a battery section 104, management circuitry 106 (also referred to as a battery management unit or BMU), and contactor circuitry 110.

The battery section 104 comprises a plurality of rechargeable batteries 107. In one embodiment, batteries 107 are implemented as battery modules 10. Although some operations of battery system 100 are discussed with respect to battery modules 10 described herein, other configurations of batteries 107 may be used in other embodiments of battery system 100. Battery section 104 is configured to store electrical energy for use by a load. Battery section 104 may apply electrical energy to a load during discharge operations of the battery section 104 and may receive electrical energy from a charger during charge operations of the battery section 104.

The illustrated battery section 104 is for discussion purposes and other arrangements of batteries 107 in battery section 104 are possible. In the depicted embodiment, the batteries 107 may be arranged in series in a plurality of respective strings 105 intermediate the system terminals 101, 103. The arrangement of batteries 107 in FIG. 5 may be referred to as a parallel set of strings 105 of batteries 107. In addition, the batteries 107 may be arranged in a plurality of banks 108 to provide a desired system voltage at terminals 101, 103 to operate a load. Batteries 107 may be arranged in any other desired configuration to provide a desired voltage and/or operational capacity of the battery system 100.

Management circuitry 106 may comprise circuitry similar to module circuitry 20 discussed above with respect to FIG. 4. For example, the management circuitry 106 may comprise interface circuitry for communicating with the load, charger, and/or circuitry of the batteries 107 of the battery section 104. The management circuitry 106 may also include processing circuitry configured to implement communications with a load, charger, and batteries 107, to process information and to control operations of the battery system 10, including for example the batteries 107. Accordingly, management circuitry 106 may also be referred to as control circuitry.

In one specific example, management circuitry 106 may control the outputting of status information regarding the battery system 100 (state of charge, voltages, currents of the battery system 100) to the external device 102 (e.g., load and/or charger). Controllers in the load or charger may be configured in one embodiment to change operations of the load or charger using information received from the battery system 100 (e.g., control the load to enter a reduced power consumption mode responsive to the state of charge of battery system 100 being less than a threshold or control the charger to increase or decrease charger current).

Furthermore, management circuitry 106 may receive information from the external device 102 (e.g., load or charger) and change operations of the battery system 100 in response thereto (e.g., issue a system shutdown command to shutdown the battery system 100). In one embodiment, management circuitry 106 and external device 102 communicate via a CAN Bus network although other configurations are possible.

Management circuitry 106 may be configured to implement logical addressing of the individual batteries 107 by assigning respective unique addresses to individual ones of the batteries 107 present in the battery system 100 and the addresses may be used for communications in one embodiment. In addition, management circuitry 106 may control the operation of one or more contactors 112, 118 as discussed further below.

Management circuitry 106 is also configured to control charging of batteries 107 in one embodiment. As mentioned above, external device 102 may be a charger configured to supply charging electrical energy to batteries 107 via terminals 101, 103. In one embodiment, the management circuitry 106 is configured to provide substantially balanced charging of batteries 107 (e.g., provide the batteries 107 at substantially the same state of charge) during charge operations of the batteries 107. For example, the processing circuits 44 of the respective batteries 107 may report information regarding electrical characteristics (e.g., voltage of cells or state of charge information of the cells) of the respective batteries 107 to management circuitry 106. Management circuitry 106 may provide control signals to control respective processing circuits 44 of the batteries 107 to control the application of different amounts of charging electrical energy to different ones of the batteries 107 to provide substantially balanced charging of the batteries 107.

For example, the management circuitry 106 may provide the control signals to the processing circuits 44 of the batteries 107 (implemented as battery modules 10 in one example). The processing circuits 44 may use the received control signals to implement desired biasing of switching circuits 24 of respective batteries 107 (configured as battery modules 10 in the described example) in an attempt to achieve substantially balanced charging of the batteries 107. In one example, if one battery 107 has a higher state of charge than others of the batteries 107, the management circuitry 107 may issue a control signal to the processing circuit 44 of the one battery 107 having the higher state of charge to reduce the biasing of the switching circuits 24 of the one battery 107 in an attempt to have the other batteries 107 receive an increased amount of electrical energy (compared with the electrical energy received by the one battery 107) to charge the other batteries 107 at a faster rate to be balanced with the one battery 107 (e.g., provide the batteries 107 at the same state of charge). In one example, one of the batteries 107 having a higher state of charge than others of the batteries 107 may be electrically isolated from a charger (e.g., using the switching circuitry 24 of the one battery 107) while the other batteries 107 receive charging electrical energy.

Management circuitry 106 may also provide data logging functions by controlling storage of information during operation of the battery system 100 (e.g., within storage circuitry of the management circuitry 106 not shown). For example, management circuitry 106 may store information regarding occurrence of alarm conditions, operational parameters (e.g., voltage, current, temperature, state of charge), and total current into or out of the battery 100 over its life or at other desired resolutions of use.

Management circuitry 106 may also be configured to implement communications with respect to a charger in one embodiment. For example, the communications may indicate to the charger when charging of the battery system 100 is appropriate or to indicate to the charger that charging may be ceased since the batteries 107 of the battery system 100 are fully charged. Other communications with the charger are possible.

Management circuitry 106 may also be configured to control system operations of battery system 100 in one embodiment. For example, if the operational temperature of the battery system 100 varies outside of a desired operational range (e.g., 0-50 degrees Celsius), the management circuitry 106 can control fans and heating or cooling elements (not shown) to provide the operational temperature of the battery system 100 in an appropriate range.

As mentioned previously, battery module 10 and battery system 100 may individually operate in engaged and disengaged modes of operation at different moments in time. In the engaged mode of operation of a battery module 10, an external device 102 may be electrically connected with battery terminals 13, 14 (FIG. 3) of the battery module 10. For example, a load may be coupled with battery terminals 13, 14 and battery module 10 may be providing electrical energy to power the load. In another example, a charger may be coupled with battery terminals 13, 14 and battery module 10 may be receiving charging electrical energy from the charger to charge the battery module 10. At other moments in time, the battery module 10 may be in a disengaged mode of operation where the battery module 10 is neither supplying nor receiving electrical energy (i.e., neither discharging nor charging) and may be electrically isolated from the external device 102 (e.g., load and/or charger), for example using the switching circuitry 24 of the battery module 10. The battery modules 10 may be operated in the engaged and disengaged modes of operation independently of others of the battery modules 10 of battery section 104.

Battery system 100 and/or an external device 102 (e.g., load or charger) may be subjected to excessive in-rush currents during transitions of batteries 107 between different operational modes (e.g., transitioning of batteries 107 implemented as battery modules 10 from the disengaged mode of operation to the engaged mode of operation). The discussion proceeds with respect to different arrangements for protecting battery system 100 and/or the external devices 102 coupled with the battery system 100 from excessive in-rush currents. In a first example, contactor circuitry 110 is provided to limit in-rush of current, while in a second example, the batteries 107 are implemented as battery modules 10 and switching circuitry 24 of the submodules 22 of the battery modules 10 are utilized to limit in-rush currents. Battery modules 10 may be configured to limit an amount of electrical energy which is conducted with respect to the battery terminals 13, 14 and cells 26 to a level below a threshold where damage to the battery modules 10 and/or external devices 102 could occur.

Contactor circuitry 110 is configured to provide electrical connection of battery system 100 with external devices 102, such as load or a charger without conducting excessive in-rush currents which may damage battery module 10, battery system 100, and/or external devices 102. In the illustrated embodiment, contactor circuitry 110 includes a main contactor 112 and pre-charge contactor circuitry 114 also referred to as first and second contactor circuits, respectively.

Main contactor 112 and pre-charge contactor circuitry 114 are individually configured to operate in engaged and disengaged modes of operation. In the engaged mode of operation of the main contactor 112 and the pre-charge contactor circuitry 114, the contactors 112, 118 are individually closed and electrically couple the batteries 107 with an external device 102 coupled with system terminals 101, 103. In the disengaged mode of operation of the main contactor 112 and the pre-charge contactor circuitry 114, the contactors 112, 118 are individually open and operate to electrically isolate the batteries 107 from an external device 102 coupled with system terminals 101, 103. As discussed further below, pre-charge contactor circuitry 114 operating in the engaged mode of operation is configured to conduct a reduced amount of current compared with main contactor 112 operating in the engaged mode of operation.

Management circuitry 106 is configured to control the contactor circuitry 110 over a transitional period between one moment in time when the battery section 104 is electrically isolated from the external device 102 (e.g., load or charger) to a subsequent moment in time when the battery section 104 is electrically coupled with the external device 102 in one embodiment. For example, the management circuitry 106 may control the contactor circuitry 110 to be open when battery system 100 is connected to the external device 102 to prevent an excessive in-rush of current into or out of battery system 100. Following electrical connection of the external device 102 to battery system 100 and during a transition from a disengaged mode of operation to the engaged mode of operation of battery system 100, management circuitry 106 may control the pre-charge contactor 118 of the pre-charge contactor circuitry 114 to be closed while contactor circuitry 112 remains open. Resistor 116 functions to limit the current to levels which will not damage components or circuits of the battery system 100 or external device 102. Thereafter, following conduction of current for an acceptable amount of time using pre-charge contactor circuitry 114 (e.g., to charge capacitances in battery system 100 and/or external devices 102) or otherwise at an appropriate time where excessive in-rush currents will be avoided, the management circuitry 106 may control the main contactor 112 to be closed to supply electrical energy from battery section 104 to a load or to supply charging current from the charger to the battery section 104. In one embodiment, both main contactor 112 and pre-charge contactor 108 may be opened substantially simultaneously by management circuitry 106 to provide electrical isolation of battery section 104 from system terminal 101.

As discussed above, the batteries 107 may be implemented using the battery modules 10 in one embodiment. The switching circuitry 24 of the individual submodules 22 of the battery modules 10 may be controlled to limit the in-rush of current upon transition from disengaged to engaged operational modes of battery module 10 or battery system 100 comprising a plurality of battery modules 10 (e.g., initiation of electrical connection of the battery module 10 or battery system 100 to an external device 102, such as load and/or a charger). In one example, the contactor circuitry 110 may be omitted and limiting of in-rush current may be implemented entirely using the switching circuitry 24 of the battery modules 10. With reference to FIG. 5, the contactor circuitry 110 may be omitted and the battery section terminal 120 and the battery terminal 101 are the same node. In this example, the rechargeable cells 26 of the battery modules 10 of the battery system 100 are electrically connected with the external device 102 via connection circuitry (e.g., circuitry intermediate terminal 120 and the external device 102) which is void of a contactor. In another example, both the contactor circuitry 110 and switching circuitry 24 are utilized to limit the in-rush of current.

In one embodiment where contactor circuitry 110 is omitted, processing circuitry 44 is configured to control switching circuitry 24 (FIG. 2) to limit in-rush currents. In one example, the charge transistors of the switching circuits 24 of the submodules 22 are biased off during operation of battery module 10 in a disengaged mode of operation. Thereafter, it may be desired to electrically charge or discharge the battery module 10. Following connection of system terminals 101, 103 with a load or charger, the processing circuitry 44 may bias the charge transistors of the switching circuitry 24 of the battery modules 10 from off to on states using an increasing biasing voltage which biases the charge transistors on over a period of time. For example, a ramped or stepped biasing voltage may be used in different embodiments. In one example, the discharge transistors may already be biased on followed by biasing of the charge transistors from an off state to an on state over a period of time sufficient to provide charging of any capacitances of battery system 100 and external device 102 and to avoid damage to battery system 100 or external device 102.

In another example, both the discharge and charge transistors of the switching circuitry 24 may be biased on substantially simultaneously over a period of time to avoid damage to the battery module 10, battery system 100, and/or external device 102. In one example, the appropriate charge and/or discharge transistors of the switching circuitry 24 may be biased on (from an off state to a fully on state) over a period of time (e.g., approximately two seconds in one embodiment).

The biasing is configured to limit current flowing with respect to the battery modules 10 to levels below a threshold where damage to electrical circuitry of battery system 100 and/or external devices 102 may occur. The biasing voltage may be applied to bias the switching circuits 24 of the battery modules 10 from off to on over a period of time during a transition of the battery module 10 and/or battery system 100 from the disengaged mode of operation to the engaged mode of operation.

As mentioned above, both the contactor circuitry 110 and switching circuitry 24 of the battery modules 10 may be used in some embodiments to limit in-rush currents to acceptable non-damaging levels. For example, the switching circuits 24 may be biased on in a ramped or stepped manner following closing of contactor 112 in one embodiment.

During operation of battery system 100 to supply electrical energy to load or receive electrical energy from a charger, one or more of the batteries 107 may partially or entirely fail. As discussed above, batteries 107 may be implemented as battery modules 10 in one embodiment. Battery modules 10 may comprise a plurality of submodules 22. A battery module 10 may experience a partial failure, for example, when one of the submodules 22 fails. As discussed above, the failed submodule 22 may be provided in a disengaged mode of operation while one or more other submodule 22 of the battery module 10 continues to operate in an engaged mode of operation.

Referring to FIG. 5, strings 105 of batteries 107 may individually operate in engaged and disengaged modes of operation where the strings 105 of batteries 107 are either electrically coupled with external device 102 or electrically isolated from external device 102, respectively. A string 105 of batteries 107 which are implemented as battery modules 10 will continue to operate in an engaged mode of operation as long as all of the battery modules 10 of the string 105 are in an engaged mode of operation (i.e., at least one submodule 22 of each of the individual battery modules 10 of the string 105 is operating in an engaged mode of operation). The batteries 107 of a string 105 which is operating in the engaged mode of operation are electrically coupled with system terminals 101, 103 to supply electrical energy to a load or receive charging electrical energy from a charger.

However, one of the batteries 107 may completely fail (e.g., all submodules 22 of a single battery module 10 are in a disengaged operational mode) during a moment in time of operation of the battery system 100. In one embodiment, all batteries 107 of the string 105 of batteries 107 which includes the failed battery 107 will be controlled to operate in a disengaged mode of operation. For example, if batteries 107 are implemented as battery modules 10, then the switching circuits 24 of the submodules 22 of the battery modules 10 of the string 105 may be opened to provide the battery modules 10 of the string 105 in the disengaged mode of operation wherein the battery modules 10 of the string 105 are electrically isolated from one of the system terminals 101, 103 in one example embodiment. Furthermore, the battery modules 10 of the disengaged string 105 are also electrically isolated from one another by the opening of switching circuits 24. The failed battery 107 of the string 105 may be replaced and the operation of the string 105 of batteries 107 may thereafter be returned to the engaged mode of operation for discharging or charging.

In one embodiment, the switching circuits 24 of battery modules 10 of a given string 105 switching from the engaged to disengaged modes of operation are controlled to substantially simultaneously open at the same moment in time to reduce electrical stresses upon the switching circuitry 24 of the individual battery modules 10. Providing the battery modules 10 of one of the strings 105 in the disengaged mode of operation may be referred to a shutdown of the string 105. The battery modules 10 of a string 105 may be electrically isolated from one of the terminals 101, 103 (e.g., by respective switching circuitry 24) during a disengaged mode of operation of the string 105. One or more other strings 105 of batteries 107 may continue to operate in an engaged mode of operation during operation of one of the strings 105 in the disengaged mode of operation. The strings 105 operating in the engaged mode of operation may continue to supply electrical energy to a load or receive electrical energy from a charger.

Accordingly, battery system 100 is configured to continue to operate in the presence of at least some types of failures. For example, as discussed above, one or more of the batteries 107 may continue to operate in an engaged mode of operation where the one or more batteries 107 are configured to receive charging current from terminals 101, 103 or supply electrical energy to a load during operation of one or more other batteries 107 in a disengaged mode of operation. Thus, at least one embodiment of battery system 100 is configured to be operational even with the presence of failures at a battery level. In addition, batteries 107 may be configured as battery modules 10 discussed above in one embodiment. Batteries 107 of battery system 100 configured as battery modules 10 may also continue to operate in engaged modes of operation during the presence of a failure of one or more cell 26 within the battery modules 10 as discussed above. Accordingly, at least one embodiment of battery system 100 including batteries 107 in the form of battery modules 10 may be operational in the presence of failures at a cell level.

Figure 5A:
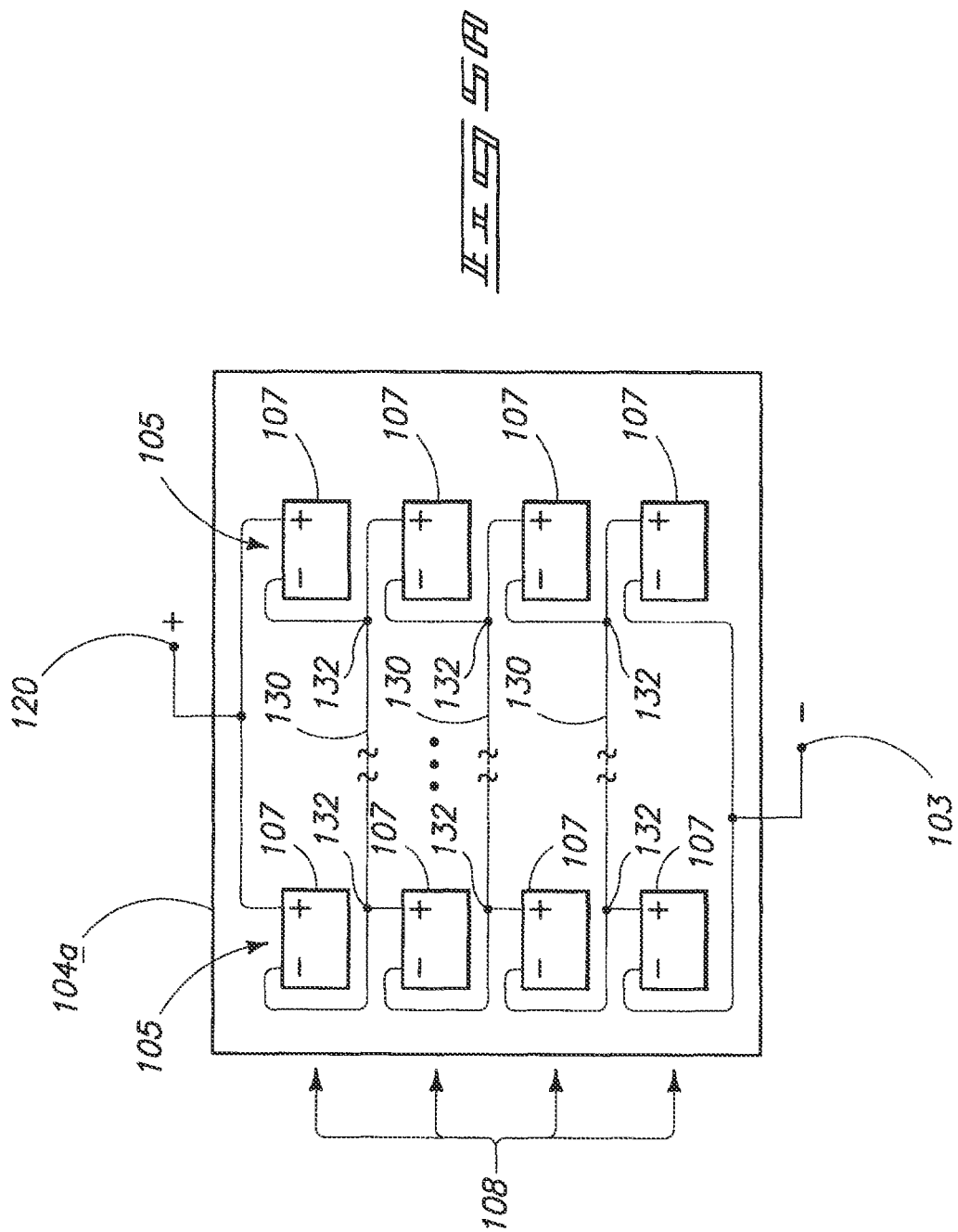
FIG. 5A is a functional block diagram of a battery section according to one embodiment.

Referring to FIG. 5A, another embodiment of battery section 104a is depicted and which may be used within battery system 100 in place of battery section 104 of FIG. 5. The arrangement or topology of batteries 107 in FIG. 5A may be referred to as a string of parallel batteries.

More specifically, similar to battery section 104, battery section 104a comprises a plurality of strings 105 of batteries 107 coupled in parallel intermediate terminals 120, 103. However, in the battery section 104a of FIG. 5A, a plurality of cross-connections 130 are provided intermediate different ones of the strings 105 of batteries 107 (and which cross-connections 130 are absent from the battery section 104 of FIG. 5).

More specifically, the cross-connections operate to electrically connect the positive terminals of batteries 107 of different strings 105 which are in the same bank 108 in the depicted embodiment. As shown in FIG. 5A, the positive terminals of batteries 107 of one bank 108 are coupled with the negative terminals of batteries 107 of an adjacent bank 108 at a plurality of nodes 132. The cross-connections 130 electrically couple the nodes 132 of one of the strings 105 with respective ones of a plurality of nodes 132 of another of the strings 105 to electrically couple the batteries 107 of one of the stings 105 in parallel with respective ones of the batteries 107 of other(s) of the strings 105.

The provision of cross-connections 130 in battery section 104a enables the battery section 104a to provide increased capacity in the presence of some failures compared with the arrangement of battery section 104 of FIG. 5. For example, as discussed above with respect to FIG. 5, an individual one of the strings 105 is provided in the disengaged mode of operation if any of the batteries 107 of the individual string 105 are in the disengaged mode of operation. However, in the arrangement of battery section 104a, the presence of one battery 107 operating in the disengaged mode of operation does not provide the respective string 105 which includes the battery 107 in a disengaged mode of operation since the other batteries 107 of the respective string 105 operating in the engaged operational mode are coupled with terminals 120, 103 via respective cross-connections 130 and the batteries 107 of an adjacent string 105.

Accordingly, one or more batteries 107 of a string 105 may continue to operate in an engaged mode of operation despite the presence of one or more batteries 107 of the same string 105 operating in the disengaged mode of operation. For example, one or more batteries 107 of a given string 105 operating in the engaged mode of operation (while another battery 107 of the given string 105 operates in the disengaged mode of operation), may receive or supply electrical energy via an appropriate cross-connection 130 and another of the strings 105 having the batteries 107 thereof in an engaged mode of operation. For example, the one or more batteries 107 operating in the engaged mode of operation of a given string 105 may be electrically coupled with one of terminals 103, 120 via a battery 107 of a different string 105 which is in the engaged mode of operation and is coupled in parallel in the same bank 108 with the battery 107 of the given string 105 which is in the disengaged mode of operation. In one embodiment, the strings 105 of batteries 107 of battery section 104a are provided in the disengaged mode of operation if all the batteries 107 connected in parallel for a respective individual one of the banks 108 are in the disengaged mode of operation.

In one embodiment, the batteries 107 are implemented using the battery modules 10 described above and the batteries 107 may individually include a plurality of submodules 22. As discussed above, an individual battery module 10 may be partially operational in an engaged mode of operation if one or more of the submodules 22 operates in the disengaged mode of operation and at least one other submodule 22 of the battery module 10 is in the engaged mode of operation. Accordingly, battery section 104a may continue to operate in an engaged mode of operation to supply electrical energy to a load or receive charging electrical energy from a charger in the presence of one or more batteries 107 operating in a disengaged operational mode or one or more submodules 22 of the batteries 107 operating in a disengaged operational mode. Battery section 104a may be considered to have increased resiliency to failures compared with battery section 104 of FIG. 5 since a string 105 of batteries 107 is not necessarily disengaged responsive to one of the batteries 107 of the string 105 being in a disengaged mode of operation.

Although two strings 105 and four banks 108 of batteries 107 are shown in each of the example configurations of FIG. 5 and FIG. 5A, other numbers of strings 105 and/or banks 108 may be provided in other embodiments.

Referring to FIG. 6, another configuration of battery system 100a is shown where contactor circuitry 114 is external of the battery system 100a. In the embodiment of FIG. 6, a plurality of contactor circuits 114 couple a system terminal 101 of battery system 100a with a load 117 and a charger 119.

Contactor circuits 114 may individually operate as discussed above to selectively electrically connect system terminal 101 with respective ones of load 117 and charger 119. In one embodiment, management circuitry 106 of battery system 100a is configured to control respective ones of the contactor circuits 114 to avoid excessive in-rush currents as discussed above with respect to FIG. 5.

Referring to FIG. 7, one embodiment of circuitry configured to implement a shutdown of a string 105 of batteries 107 is depicted for the configuration of battery section 104 shown in FIG. 5. In one embodiment, a string 105 of batteries 107 of battery section 104 may be shutdown where the string 105 previously operating in an engaged mode of operation changes to operating in a disengaged mode of operation.

In some embodiments, batteries 107 of the string 105 may be implemented using battery modules 10 as discussed above. Battery modules 10 individually have switching circuitry 24 discussed above which may be subjected to electrical stress if the switching circuitry 24 of one of the battery modules 10 of a string 105 opens (i.e., providing the one battery module 10 in the disengaged mode of operation) while the switching circuitry 24 of the other battery modules 10 of the same string 105 are closed (i.e., in the engaged mode of operation).

In one embodiment, it is desired to simultaneously control the switching circuitry 24 (of all of the battery modules 10 of a string 105 to be shutdown) to switch from a closed state to an open state to avoid potentially damaging electrical stress upon any of the switching circuitry 24 of the battery modules 10. The depicted embodiment of FIG. 7 includes a shutdown controller 140 which may also be referred to as a string controller and is configured to selectively control shutdown of a string 105 of batteries 107 (e.g., implemented as battery modules 10). Accordingly, shutdown controller 140 may also be referred to as control circuitry. Shutdown controllers 140 may be provided for respective ones of the strings 105 in one configuration.

One shutdown controller 140 may control a respective string 105 of batteries 107 to operate between an engaged mode of operation where the batteries 107 are configured to receive and/or supply electrical energy with respect to an external device 102 and a disengaged mode of operation where the batteries 107 are electrically isolated from an external device 102 and do not receive nor supply electrical energy. In one embodiment where batteries 107 are implemented using battery modules 10, shutdown controller 140 is configured to substantially simultaneously control the switching circuitry 24 of all of the battery modules 10 to open when a string 105 of the battery modules 10 is to be provided in the disengaged mode of operation and to avoid stressing the switching circuitry 24 of the battery modules 10.

Shutdown controller 140 is in electrical communication with management circuitry 106 in the depicted arrangement. In one embodiment, it is desired to implement a shutdown of batteries 107 of a string 105 after shutdown of the string 105 is determined to be appropriate using hardware void of any circuitry (e.g., processors) configured to execute code, instructions, or programming which may be unsuitably slow in controlling switching circuitry 24 of the respective batteries 107 (e.g., busy performing other tasks) when desired to change the batteries 107 from an engaged mode of operation to a disengaged mode of operation.

Accordingly, in one embodiment, circuitry configured to implement a shutdown of a string 105 of batteries 107 (including shutdown controller 140) is implemented entirely in hardware void of a processor or any other hardware configured to execute code. For example, shutdown controller 140 may be void of a processor in one embodiment which is connected with the batteries 107 of the respective string 105 via a plurality of serial cables 142 (i.e., cables 142 are used for communications not conducting operational electrical energy from or to the batteries 107 during discharging or charging in the depicted embodiment).

In one embodiment, management circuitry 106 may provide a system shutdown command to a plurality of shutdown controllers 140 of a plurality of strings 105 of batteries 107 to simultaneously switch the operation of the batteries 107 of the strings 105 from the engaged mode of operation to the disengaged mode of operation. Upon receipt of the system shutdown command, the individual shutdown controllers 140 may substantially simultaneously control the batteries 107 to enter a disengaged mode of operation.

In another embodiment, a shutdown of a string 105 may be initiated by one of the batteries 107 of the string 105. For example, batteries 107 are individually configured to assert an enable signal upon a respective cable 142 during operation of the respective battery 107 in an engaged mode of operation. Shutdown controller 140 instructs the batteries 107 to remain in the engaged mode of operation as long as enabled signals are asserted by each of the batteries 107. However, if one of the batteries 107 changes the state from an enabled to disabled signal (indicating the disengaged mode of operation of the respective battery 107), the shutdown controller 140 controls all of the batteries 107 of the respective string 105 to change from an engaged mode of operation to a disengaged mode of operation. In one embodiment, the shutdown controller 140 controls the batteries 107 of the respective string 105 to substantially simultaneously change from the engaged mode of operation to the disengaged mode of operation. If appropriate, one or more strings 105 of batteries 107 of battery section 104 (FIG. 5) may remain in an engaged mode of operation if one or more strings 105 are provided in the disengaged mode of operation.

In some embodiments, management circuitry 106 may send a shutdown command to one or more of the shutdown controllers 140. Shutdown controllers 140 which receive the shutdown command may instruct respective batteries 107 coupled with the controllers 140 to enter a disengaged mode of operation.

In one embodiment, processing circuitry 44 of the individual batteries 107 implemented as battery modules 10 may be used to change an operational mode of the respective battery modules 10 from an engaged mode of operation to a disengaged mode of operation. In this embodiment, the shutdown controllers 140 may be omitted or used in addition to shutdown operations of processing circuits 44 of battery modules 10. For example, processing circuitry 44 may detect an alarm condition described herein, and in response to the detection of the alarm condition, issue a shutdown command to provide the respective battery module 10 in a disengaged mode of operation while also notifying management circuitry 106 of the shutdown of the respective battery module 10. Thereafter, management circuitry 106 may notify other battery modules 10 of the shutdown of the individual battery module 10 and which may result in additional battery modules 10 being shutdown. For example, the management circuitry 106 may issue a system shutdown command as discussed further below to the processing circuits 44 of the respective battery modules 10 to initiate a shutdown of the battery modules 10 of the battery system 100.

In another example, processing circuitry 44 of one of the battery modules 10 may receive a command to change the mode of operation of the respective battery module 10 to a disengaged mode of operation from processing circuitry 44 of another battery module 10, management circuitry 106 or other source in illustrative examples and may initiate a shutdown of the one of the battery modules 10.

Accordingly, processing circuitry 44 of a respective battery module 10 may be used to initiate a change of the operational mode from engaged to disengaged modes of operation for the single respective battery module 10, a string 105 of battery modules 10, or all battery modules 10 of all strings 105 of battery section 104 in one embodiment.

Referring to FIG. 7A, another embodiment of circuitry configured to implement a shutdown of batteries 107 is shown for the configuration of battery section 104a shown in FIG. 5a. In one embodiment, the batteries 107 of the battery section 104a may be shutdown where the batteries 107 previously operating in an engaged mode of operation change to operating in a disengaged mode of operation.

In one embodiment, and similar to the embodiment of FIG. 7 discussed above, the circuitry configured to implement the shutdown of battery section 104a is void of circuitry configured to execute code and includes shutdown controller 140 and cables 142, 144. Shutdown controller 140 is coupled with the batteries 107 using a plurality of serial cables 142. Furthermore, batteries 107 of a common bank 108 are connected by parallel cables 144. A bank 108 of batteries 107 may assert an enable signal via an appropriate serial cable 142 if at least one of the batteries 107 of a common bank 108 is operating in an engaged mode of operation. However, if all batteries 107 of a common bank 108 enter a disengaged mode of operation, then the signal upon the parallel cable 144 for the common bank 108 will be disabled which is detected by shutdown controller 140 via serial cables 142. Shutdown controller 140 may proceed to instruct all batteries 107 coupled with the shutdown controller to shutdown by entering a disengaged mode of operation. In one embodiment, shutdown controller 140 substantially simultaneously controls the batteries 107 coupled with the shutdown controller 140 to enter the disengaged mode of operation. Switching circuitry 24 of batteries 107 implemented as battery modules 10 may operate to electrically isolate battery modules 10 from at least one of terminals 101, 103 to provide the battery modules 10 in the disengaged mode of operation responsive to a shutdown command in one embodiment.

As discussed above, system shutdown commands may be issued to provide the battery system 100 or 100a in a disengaged mode of operation where the batteries 107 are electrically isolated from at least one of system terminals 101, 103 and initiate a shutdown of the individual battery module 10 which failed to respond or may initiate a system shutdown of the battery system 100.

In another example, a system shutdown may be implemented responsive to information received from a load. For example, a load may report a problem or failure (e.g., internal to the load) to management circuitry 106 which may then initiate a system shutdown.

In another example, a system shutdown may be initiated responsive to all the battery modules 10 of a single common parallel bank operating in a disengaged mode of operation. In another example, a system shutdown may be initiated responsive to an alarm condition with respect to one or more operational parameter of a battery module 10 or submodule 22 (e.g., electrical characteristics such as cell voltage, submodule voltage, submodule current or out-of-range temperature). Accordingly, in one embodiment, an individual submodule 22 of an individual battery module 10 may be provided in the disengaged mode of operation responsive to an alarm condition being present within the respective individual submodule 22 or individual battery module 10, or responsive to communications received from externally of the individual battery module 10 (e.g., received communications including a system shutdown command from management circuitry 106).

Individual battery systems 100 or 100a may be configured differently to determine whether a given event will result in a system shutdown. For example, some battery systems 100 may be more tolerant to alarm conditions while other battery systems 100 may be configured to be shutdown in the presence of any alarm conditions.

Referring to FIG. 8, example monitoring operations of operational parameters are described in one embodiment. Processing circuitry 44 of module circuitry 20 (e.g., shown in FIG. 2) of a battery module 10 is configured to monitor various operational parameters of battery module 10 and submodules 22 thereof as discussed above. For example, processing circuitry 44 is coupled with various sensors which provide current monitoring 52, voltage monitoring 50, and temperature monitoring 54 in the depicted example. Current monitoring 52 may comprise circuitry to enable monitoring of currents flowing into and out of respective submodules 22 via respective resistors 34 in one embodiment. Voltage monitoring 50 may comprise circuitry to enable monitoring of voltages of individual cells 26 of the submodules 22 as well as the voltages of the submodules 22 in one embodiment. Temperature monitoring 54 may enable monitoring of different portions of the battery module 10 including the rechargeable cells 26 and switching circuits 54 in one embodiment. Circuitry to provide monitoring of other operational parameters may be used in other embodiments.

As discussed above, processing circuitry 44 may also issue control signals to logic to control the biasing of charge and discharge transistors of switching circuits 24 of the respective submodules 22 in one embodiment.

At least some embodiments described herein may provide improved operations in some implementations by isolating failed components of a rechargeable battery system, rechargeable battery module, or rechargeable battery submodule into a disengaged mode of operation while other properly operating components may remain in an engaged mode of operation. Accordingly, in some embodiments, electrical energy may be supplied to a load or received from a charger for charging even in the presence of a failure of a given component. Furthermore, some embodiments provide improved flexibility and scalability in design of rechargeable battery systems to accommodate a wide variety of applications compared with other battery system designs.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

Further, aspects herein have been presented for guidance in construction and/or operation of illustrative embodiments of the disclosure. Applicant(s) hereof consider these described illustrative embodiments to also include, disclose, and describe further inventive aspects in addition to those explicitly disclosed. For example, the additional inventive aspects may include less, more and/or alternative features than those described in the illustrative embodiments. In more specific examples, Applicants consider the disclosure to include, disclose and describe methods which include less, more and/or alternative steps than those methods explicitly disclosed as well as apparatus which includes less, more and/or alternative structure than the explicitly disclosed structure.

What is claimed is:

1. A battery system comprising:
   a first system terminal;
   a second system terminal; and
   a plurality of battery strings coupled in parallel between the first system terminal and the second system terminal, wherein individual ones of the battery strings comprise a plurality of rechargeable batteries coupled in series between the first system terminal and the second system terminal,
   wherein individual ones of the battery strings are configured to operate in an engaged mode of operation where the individual battery string is electrically coupled with the first and second system terminals and configured to at least one of supply and receive electrical energy with respect to the first and second system terminals and a disengaged mode of operation where the individual battery string is configured to not supply nor receive electrical energy with respect to the first and second system terminals;
   wherein the batteries of an individual one of the strings individually comprise switching circuitry configured to electrically couple the individual battery with one of the first and second system terminals during operation of the individual string in the engaged mode of operation and to electrically isolate the individual battery from the one of the first and second system terminals during operation of the individual string in the disengaged mode of operation.

2. The system of claim 1 wherein the batteries of the individual one of the battery strings are configured to be electrically isolated from the batteries of others of the battery strings during operation of the individual one of the battery strings in the disengaged mode of operation.

3. The system of claim 1 wherein the individual one of the battery strings is configured to electrically isolate the rechargeable batteries of the individual one of the battery strings from the one of the first and second system terminals during operation of the individual one of the battery strings in the disengaged mode of operation.

4. The system of claim 1 wherein the individual one of the battery strings is configured to operate in the engaged mode of operation during operation of at least an other of the battery strings in the disengaged mode of operation.

5. The system of claim 1 wherein individual ones of the rechargeable batteries comprise a plurality of rechargeable cells configured to store electrical energy, and wherein the rechargeable batteries are individually configured to operate at different moments in time wherein different numbers of the cells of the individual rechargeable battery at least one of supply and receive electrical energy with respect to the first and second system terminals.

6. The system of claim 1 wherein individual ones of the rechargeable batteries comprise a plurality of submodules individually comprising a plurality of rechargeable cells configured to store electrical energy, and wherein the submodules are individually configured to operate in an engaged mode of operation wherein the cells of the individual submodule at least one of supply and receive electrical energy with respect to the first and second system terminals and a disengaged mode of operation wherein the cells of the individual submodule do not supply nor receive electrical energy with respect to the first and second system terminals.

7. The system of claim 6 wherein one submodule of one of the batteries is configured to operate in the engaged mode of operation during operation of an other submodule of the one of the batteries in the disengaged mode of operation.

8. The system of claim 1 further comprising control circuitry configured to control electrical isolation of the batteries of the one of the battery strings from the one of the first and second system terminals during operation of the one of the battery strings in the disengaged mode of operation.

9. The system of claim 8 wherein the control circuitry is configured to electrically isolate all of the batteries of the one of the battery strings from the one of the first and second system terminals during operation of the one of the battery strings in the disengaged mode of operation.

10. The system of claim 8 wherein the control circuitry is void of any processing circuitry configured to execute code.

11. The system of claim 8 wherein the control circuitry is implemented entirely in hardware void of any processing circuitry configured to execute code.

12. The system of claim 8 wherein the control circuitry is configured to substantially simultaneously electrically isolate all of the batteries of the one of the battery strings operating in the engaged mode of operation from the one of the first and second system terminals at a single moment in time to initiate operation of the one of the battery strings in the disengaged mode of operation.

13. The system of claim 1 further comprising control circuitry configured to control the one of the battery strings to operate in the disengaged mode of operation responsive to an alarm condition being present in the one of the battery strings.

14. The system of claim 13 wherein the alarm condition indicates an electrical characteristic of at least one battery of the one of the battery strings triggering a threshold.

15. The system of claim 1 wherein the battery strings are individually configured to operate in the engaged and disengaged modes of operation independent of others of the battery strings.

16. The system of claim 1 wherein all of the batteries comprise a switch in series with at least one rechargeable cell.

17. A battery system comprising:
a first system terminal;
a second system terminal; and
a plurality of battery strings coupled in parallel between the first system terminal and the second system terminal, wherein individual ones of the battery strings comprise a plurality of rechargeable batteries coupled in series between the first system terminal and the second system terminal;
wherein:
the batteries of an individual one of the battery strings are coupled in series at a plurality of nodes intermediate respective ones of the batteries of the individual battery string;
the nodes of a first of the battery strings are coupled with the nodes of a second of the battery strings to electrically couple the batteries of the first of the battery strings in parallel with respective ones of the batteries of the second of the battery strings; and
wherein the batteries of an individual one of the strings individually comprise switching circuitry configured to electrically couple the individual battery with one of the first and second system terminals during operation of the individual string in the engaged mode of operation and to electrically isolate the individual battery from the one of the first and second system terminals during operation of the individual string in the disengaged mode of operation.

18. The system of claim 17 wherein the batteries of the individual one of the strings are individually configured to electrically isolate themselves from other batteries of the one of the strings.

19. The system of claim 17 wherein the batteries individually comprise a plurality of submodules which individually comprise:
a first submodule terminal;
a second submodule terminal; and
a plurality of rechargeable cells electrically coupled between the first and second submodule terminals,
wherein the rechargeable cells of the individual one of the submodules of one of the batteries are configured to at least one of supply and receive electrical energy during an engaged mode of operation of the individual one of the submodules and to not supply nor receive electrically energy during a disengaged mode of operation of the individual one of the submodules.

20. The system of claim 19 wherein one of the submodules of one of the batteries is configured to operate in the engaged mode of operation during operation of another of the submodules of the one of the batteries in a disengaged mode of operation.

21. The system of claim 17 wherein the batteries individually comprise a plurality of submodules which individually comprise:
a first submodule terminal;
a second submodule terminal;
a plurality of rechargeable cells electrically coupled between the first and second submodule terminals; and
wherein the switching circuitry is configured to electrically couple the one of the first and second system terminals with one of the first and second submodule terminals of the individual one of the submodules during an engaged mode of operation of the individual one of the submodules and to electrically isolate the one of the first and second system terminals from the one of the first and second submodule terminals of the individual one of the submodules during a disengaged mode of operation of the individual one of the submodules.

22. The system of claim 21 wherein one of the submodules of one of the batteries is configured to operate in the engaged mode of operation during operation of another of the submodules of the one of the batteries in a disengaged mode of operation.

23. The system of claim 17 wherein individual ones of the rechargeable batteries comprise a plurality of rechargeable cells configured to store electrical energy, and wherein the rechargeable batteries are individually configured to operate at different modes at different moments in time wherein different numbers of the cells of the individual rechargeable battery are configured to one of supply or receive electrical energy at the different moments in time.

24. The system of claim 17 wherein the batteries of the individual one of the battery strings are individually configured to operate in an engaged mode of operation where the individual battery is configured to one of supply and receive electrical energy with respect to the first and second system terminals and a disengaged mode of operation where the individual battery is configured to not supply nor receive electrical energy with respect to the first and second system terminals.

25. The system of claim 24 wherein at least one battery of a first of the battery strings operates in the engaged mode of operation during operation of another of the batteries of the first of the battery strings in the disengaged mode of operation.

26. The system of claim 25 wherein the at least one battery operates in the engaged mode of operation during the operation of the another of the batteries of the first battery string in the disengaged mode of operation only if an individual battery of another of the battery strings which is in parallel with the another of the batteries is in the engaged mode of operation.

27. The system of claim 17 wherein the batteries are individually configured to operate in an engaged mode of operation wherein an individual battery is configured to at least one of supply and receive electrical energy with respect to the first and second system terminals and a disengaged mode of operation wherein the individual battery is configured to not supply nor receive electrical energy with respect to the first and second system terminals.

28. The system of claim 17 further comprising control circuitry to control operation of all of the batteries in the engaged and disengaged modes of operation and to substantially simultaneously switch operation of all of the batteries from the engaged mode of operation to the disengaged mode of operation.

29. The system of claim 28 wherein the control circuitry is void of any processing circuitry configured to execute code.

30. The system of claim 28 wherein the control circuitry is implemented entirely in hardware void of any processing circuitry configured to execute code.

31. A battery system operational method comprising:
conducting electrical energy between a battery system comprising a plurality of strings of rechargeable batteries and an external device which is coupled with a terminal of the battery system during an engaged mode of operation of the strings of the batteries, and wherein the strings of the batteries are coupled in parallel with one another at the terminal and individual ones of the strings of batteries comprise a plurality of rechargeable batteries coupled in series with the terminal; and
operating one of the strings of batteries in a disengaged mode of operation where electrical energy is not conducted between the batteries of the one of the strings of batteries and the external device;
wherein the batteries of the strings of batteries individually comprise switching circuitry configured to selectively electrically couple the respective batteries with the terminal, and wherein the operating comprises opening the switching circuitry of the batteries of the one of the strings of batteries.

32. The method of claim 31 further comprising electrically isolating the batteries of the one of the strings of batteries from the batteries of an other of the strings of batteries.

33. The method of claim 31 wherein the operating comprises electrically isolating the batteries of the one of the strings of batteries from the terminal.

34. The method of claim 31 further comprising operating an other of the strings of batteries in the engaged mode of operation during the operating the one of the strings of batteries in the disengaged mode of operation.

35. The method of claim 31 wherein individual ones of the batteries comprise a plurality of rechargeable cells, and wherein the conducting using one of the batteries comprise conducting with respect to different numbers of the rechargeable cells of the one of the batteries.

36. The method of claim 31 wherein individual ones of the batteries comprise a plurality of submodules individually comprising a plurality of rechargeable cells, and wherein the conducting using one of the batteries comprises conducting using different numbers of the submodules of the one of the batteries at different moments in time.

37. The method of claim 31 further comprising controlling the one of the strings of batteries to change from the engaged mode of operation to the disengaged mode of operation.

38. The method of claim 37 wherein the controlling comprises switching the one of the strings of batteries from the engaged mode of operation to the disengaged mode of operation without execution of executed code.

39. The method of claim 37 wherein the controlling comprises switching the one of the strings of batteries from the engaged mode of operation to the disengaged mode of operation using control circuitry void of processing circuitry configured to execute code.

40. The method of claim 37 wherein the controlling comprises substantially simultaneously electrically isolating the batteries of the one of the strings of batteries during the change from the engaged mode of operation to the disengaged mode operation.

41. The method of claim 37 further comprising detecting an alarm condition being present in the one of the stings of batteries, and the controlling comprises controlling responsive to the detecting.

42. The method of claim 41 wherein the detecting comprises detecting an electrical characteristic of at least one of the batteries of the one of the strings of batteries triggering a threshold.

43. The method of claim 31 further comprising operating individual ones of the strings of batteries in the engaged and disengaged modes of operation independent of operation of others of the strings of batteries in the engaged and disengaged modes of operation.

44. A battery system operational method comprising:
supplying electrical energy to a plurality of strings of rechargeable batteries coupled in parallel intermediate first and second system terminals, wherein the rechargeable batteries of an individual one of the strings are coupled in series intermediate the first and second system terminals; and
discharging electrical energy from the rechargeable batteries to a load coupled with the first and second system terminals,
wherein discharging one of the rechargeable batteries of one of the strings comprises discharging the electrical energy from the one rechargeable battery via another of the strings;
and wherein the batteries of the strings individually comprise switching circuitry configured to electrically couple the individual battery with one of the first and second system terminals during operation of the string of the individual battery in the engaged mode of operation and to electrically isolate the individual battery from the one of the first and second system terminals during operation of the string of the individual battery in the disengaged mode of operation.

45. The method of claim 44 wherein the discharging the one of the rechargeable batteries comprises conducting electrical energy with respect to the one of the rechargeable batteries via an electrical connection intermediate the one and another of the strings.

46. The method of claim 44 further comprising electrically isolating another of the rechargeable batteries of the one of the strings from the one of the first and second system terminals during the discharging the one rechargeable battery.

47. The method of claim 44 further comprising electrically isolating another of the rechargeable batteries of the one of the strings from the one of the rechargeable batteries of the one of the strings during the discharging the one rechargeable battery.

48. The method of claim 47 further comprising detecting a fault in the another of the rechargeable batteries of the one of the strings and wherein the electrically isolating is responsive to the detecting.

49. The method of claim 47 wherein the discharging the one rechargeable battery comprises conducting electrical energy with respect to the one of the rechargeable batteries of the one of the strings via one of the rechargeable batteries of the another of the strings which is in parallel with the another of the rechargeable batteries of the one of the strings.

50. The method of claim 44 wherein the rechargeable batteries individually comprise a plurality of submodules which individually comprise a plurality of rechargeable cells, and further comprising electrically isolating the rechargeable cells of one of the submodules of one of the rechargeable batteries while at least one of supplying and discharging electrical energy with respect to another of the submodules of the one of the rechargeable batteries.

* * * * *